United States Patent
Hosaka et al.

(10) Patent No.: US 10,143,119 B2
(45) Date of Patent: Nov. 27, 2018

(54) NOZZLE MANAGEMENT SYSTEM

(71) Applicant: FUJI CORPORATION, Chiryu (JP)

(72) Inventors: Hideki Hosaka, Anjyo (JP); Yoshinori Yamashita, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 458 days.

(21) Appl. No.: 14/895,756

(22) PCT Filed: Jun. 3, 2013

(86) PCT No.: PCT/JP2013/065364
§ 371 (c)(1),
(2) Date: Dec. 3, 2015

(87) PCT Pub. No.: WO2014/196002
PCT Pub. Date: Dec. 11, 2014

(65) Prior Publication Data
US 2016/0120081 A1    Apr. 28, 2016

(51) Int. Cl.
*H05K 13/04* (2006.01)
*B05B 15/00* (2018.01)
*G05B 15/02* (2006.01)
*B05B 15/55* (2018.01)

(52) U.S. Cl.
CPC ......... *H05K 13/0408* (2013.01); *B05B 15/55* (2018.02)

(58) Field of Classification Search
CPC ..... H05K 13/0408; B05B 15/55; G05B 15/02
USPC ........................................................ 700/283
See application file for complete search history.

(56) References Cited

U.S. PATENT DOCUMENTS

| 4,651,863 | A | 3/1987 | Reuter et al. |
| 6,176,007 | B1* | 1/2001 | Kashiwagi ......... H05K 13/0408 29/709 |
| 6,195,876 | B1* | 3/2001 | Koyama ............. H05K 13/028 29/33 J |
| 6,223,425 | B1 | 5/2001 | Asai et al. |

(Continued)

FOREIGN PATENT DOCUMENTS

| DE | 94 09 606 U1 | 9/1994 |
| JP | 2010 258185 | 11/2010 |

(Continued)

OTHER PUBLICATIONS

International Search Report dated Jul. 2, 2013 in PCT/JP13/065364 filed Jun. 3, 2013.
Extended European Search Report dated Nov. 17, 2016 in Patent Application No. 13886167.9.

(Continued)

*Primary Examiner* — Charles Kasenge
(74) *Attorney, Agent, or Firm* — Oblon, McClelland, Maier & Neustadt, L.L.P.

(57) ABSTRACT

In a nozzle management system provided with multiple nozzle management devices, a control device includes a housed nozzle information acquisition section that acquires information related to all suction nozzles housed in multiple nozzle management devices, first determination section that determines whether all the required suction nozzles to be transferred to a nozzle tray are housed in a prescribed nozzle housing device, and a second determination section that determines whether non-housed suction nozzles which are not housed in the prescribed nozzle housing device from among the required suction nozzles are housed in another suction nozzle housing device.

8 Claims, 15 Drawing Sheets

(56) References Cited

U.S. PATENT DOCUMENTS

| | | | | |
|---|---|---|---|---|
| 6,266,873 B1* | 7/2001 | Kitamura | ........... | H05K 13/0408 |
| | | | | 29/739 |
| 6,662,437 B2* | 12/2003 | Kawashima | ....... | H05K 13/0413 |
| | | | | 29/740 |
| 6,729,018 B1* | 5/2004 | Takano | .............. | H05K 13/0413 |
| | | | | 29/564.1 |
| 8,328,498 B2* | 12/2012 | Higashida | .......... | H05K 13/0452 |
| | | | | 414/749.4 |
| 2002/0031279 A1* | 3/2002 | Shimizu | ............. | H05K 13/0413 |
| | | | | 382/291 |
| 2002/0069524 A1* | 6/2002 | Kawashima | ....... | H05K 13/0413 |
| | | | | 29/832 |
| 2006/0111222 A1 | 5/2006 | Yasui | | |
| 2008/0309260 A1* | 12/2008 | Kanai | ................... | H02K 41/03 |
| | | | | 318/38 |
| 2010/0014948 A1* | 1/2010 | Higashida | .......... | H05K 13/0434 |
| | | | | 414/222.05 |
| 2010/0229380 A1* | 9/2010 | Endo | .................. | H05K 13/0452 |
| | | | | 29/760 |
| 2011/0008534 A1* | 1/2011 | Sahoda | .............. | H01L 21/6715 |
| | | | | 427/209 |
| 2011/0290178 A1* | 12/2011 | Shimai | ................... | B05D 1/002 |
| | | | | 118/75 |

FOREIGN PATENT DOCUMENTS

| | | |
|---|---|---|
| JP | 2012 4306 | 1/2012 |
| JP | 2012 114237 | 6/2012 |

\* cited by examiner

[FIG. 1]
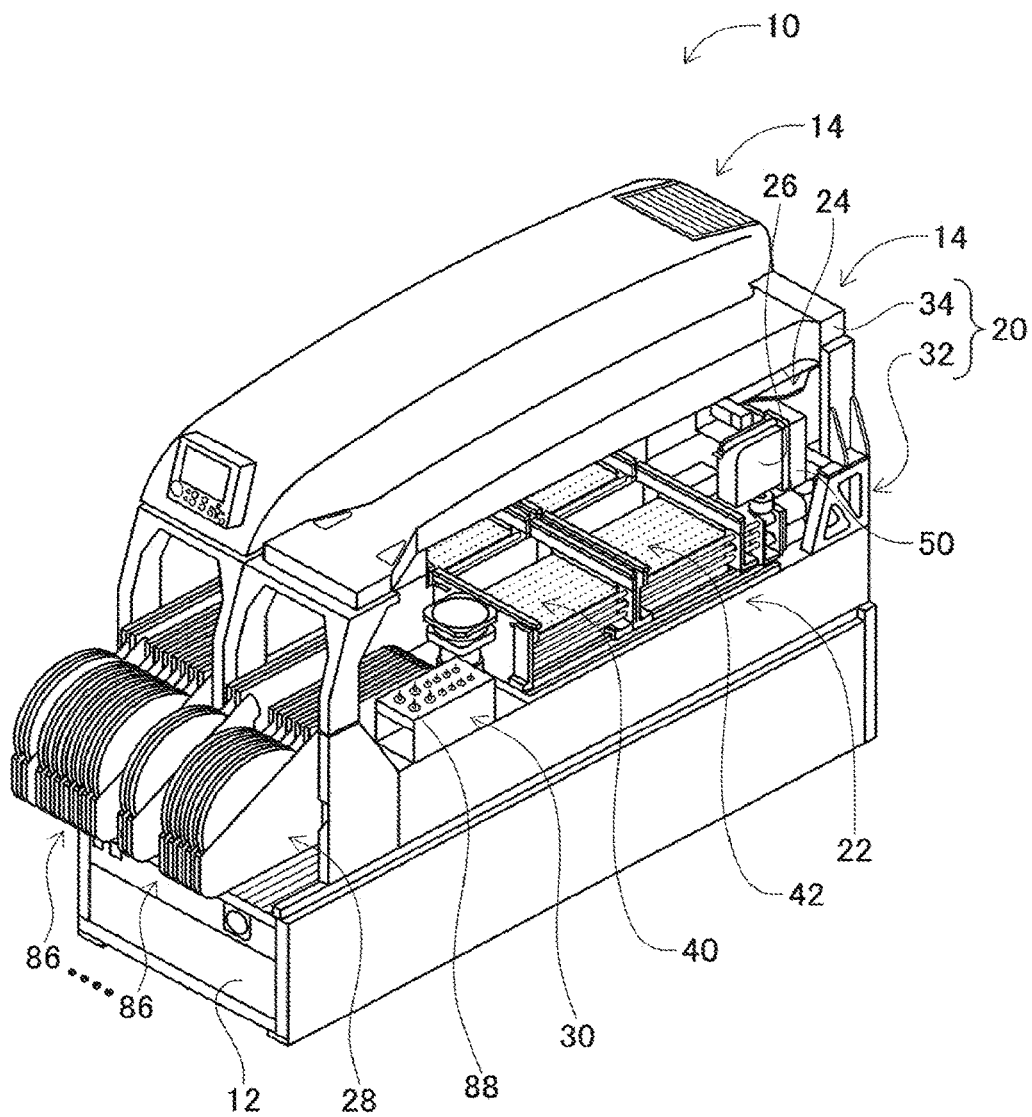

[FIG. 2]
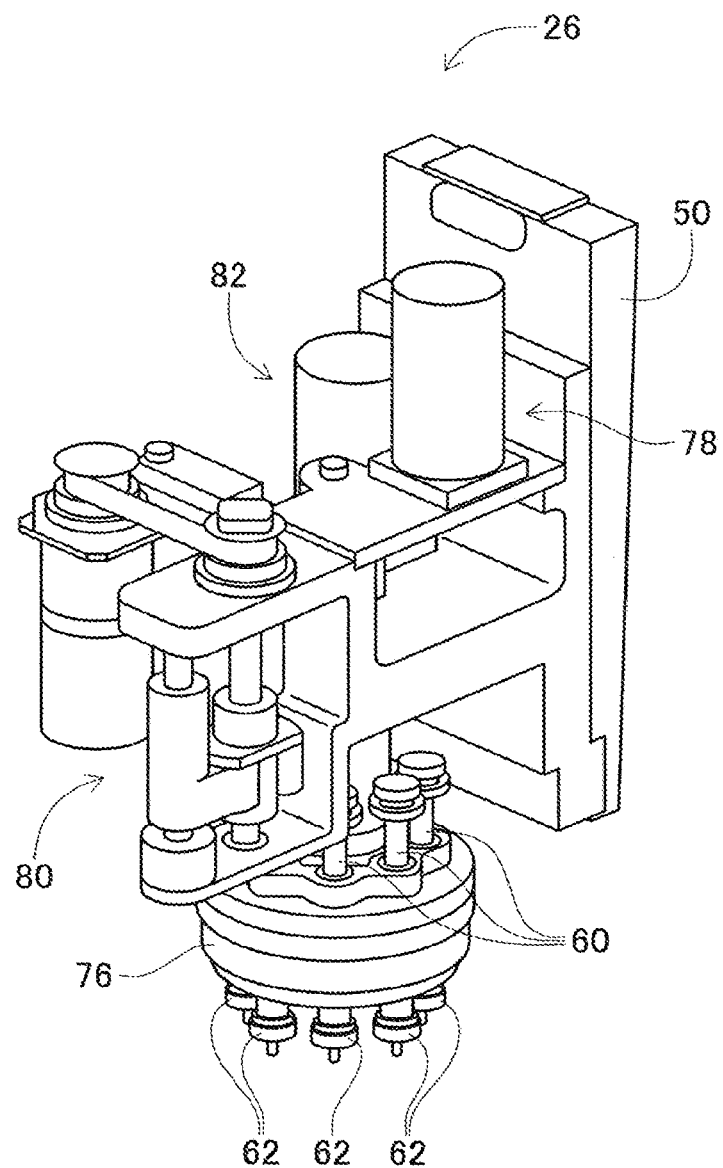

[FIG. 3]
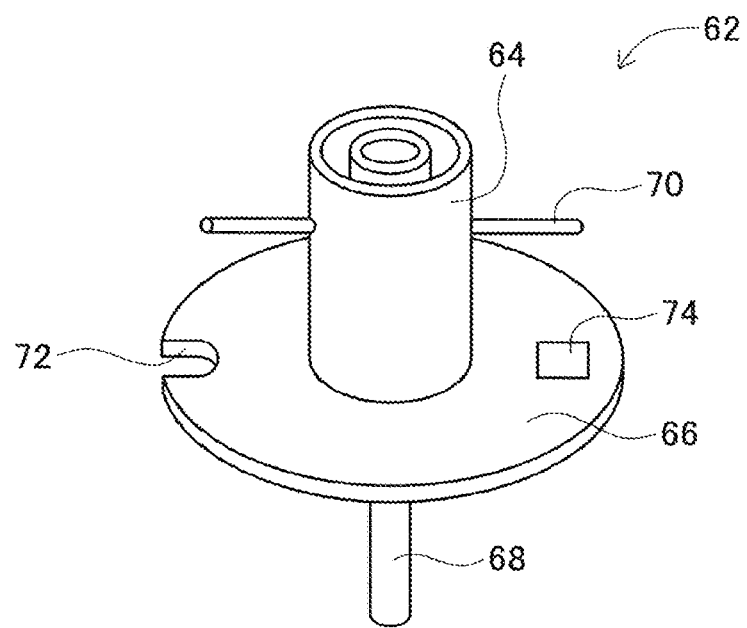

[FIG. 4]
(a)
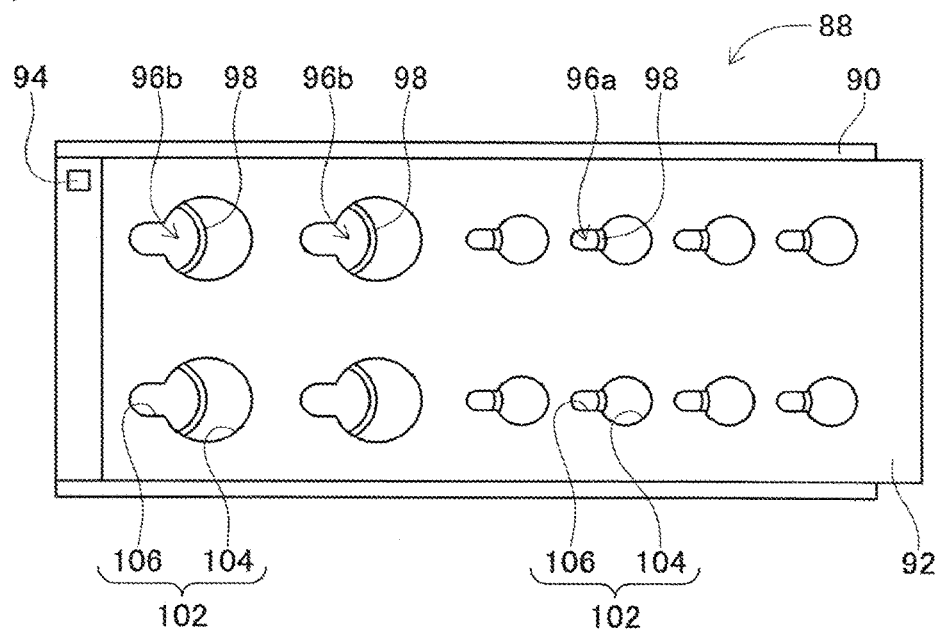
(b)
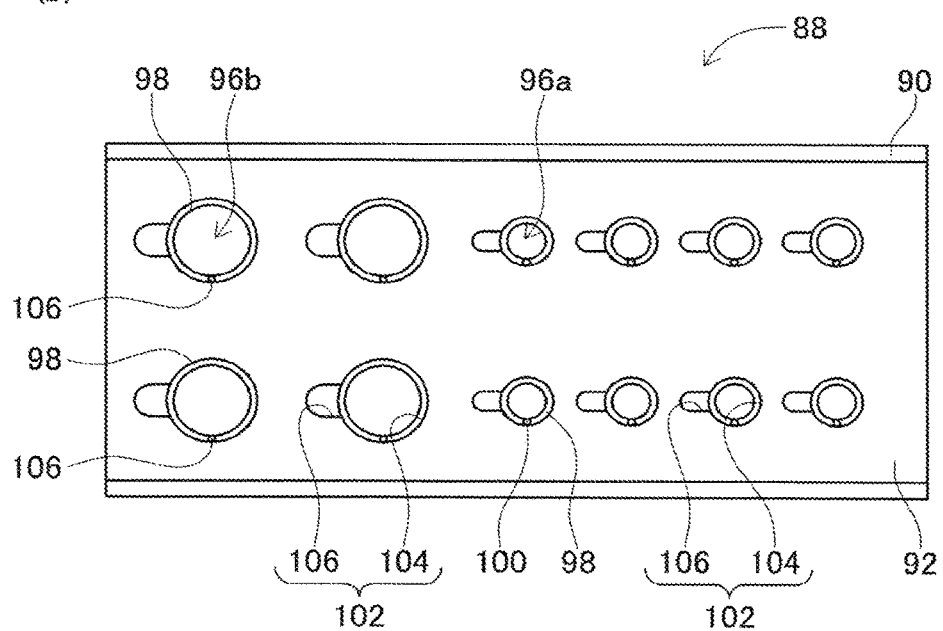

[FIG. 5]
(a)
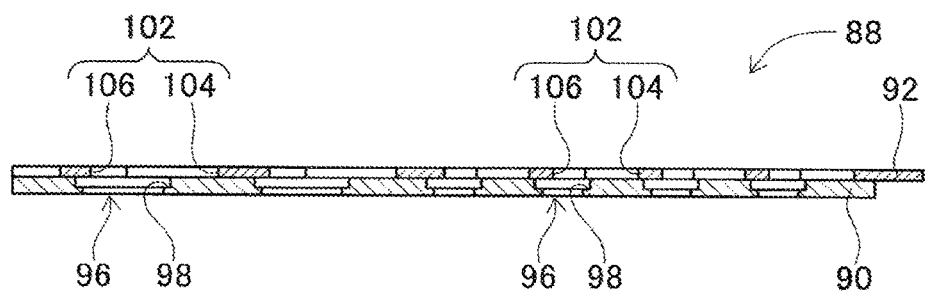
(b)
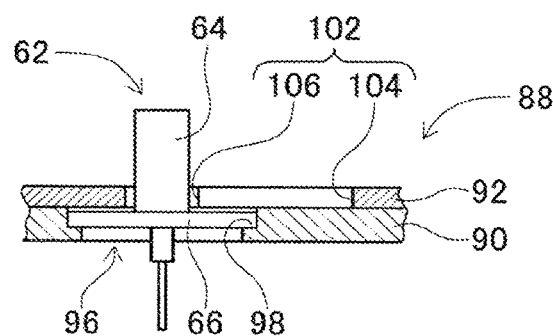

[FIG. 6]
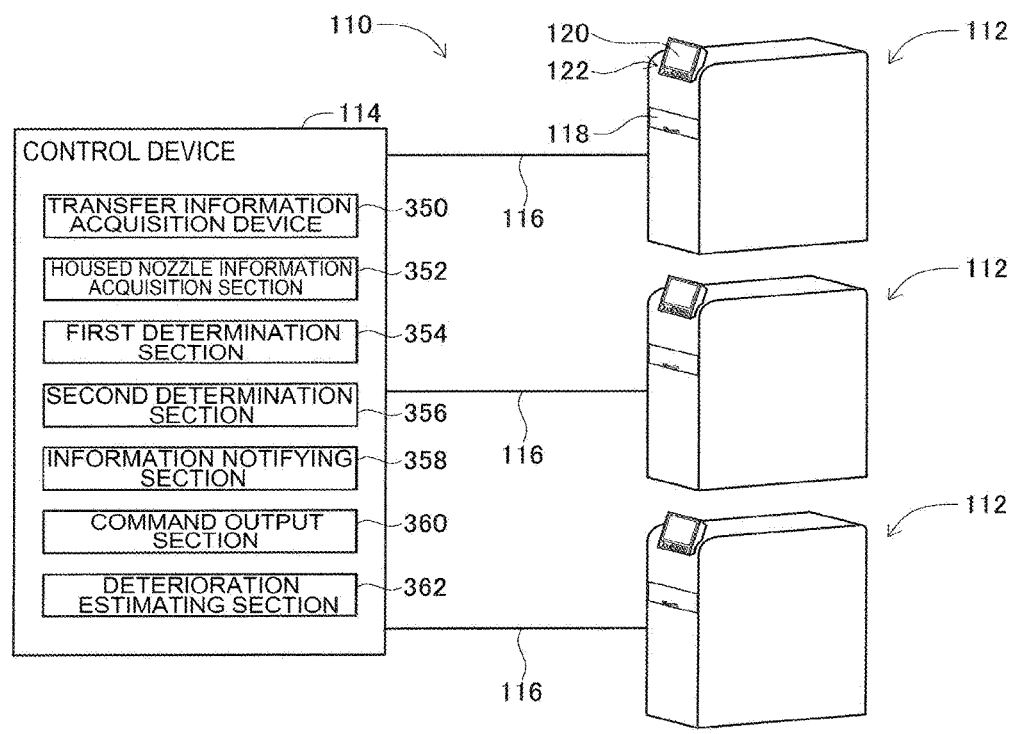

[FIG. 7]
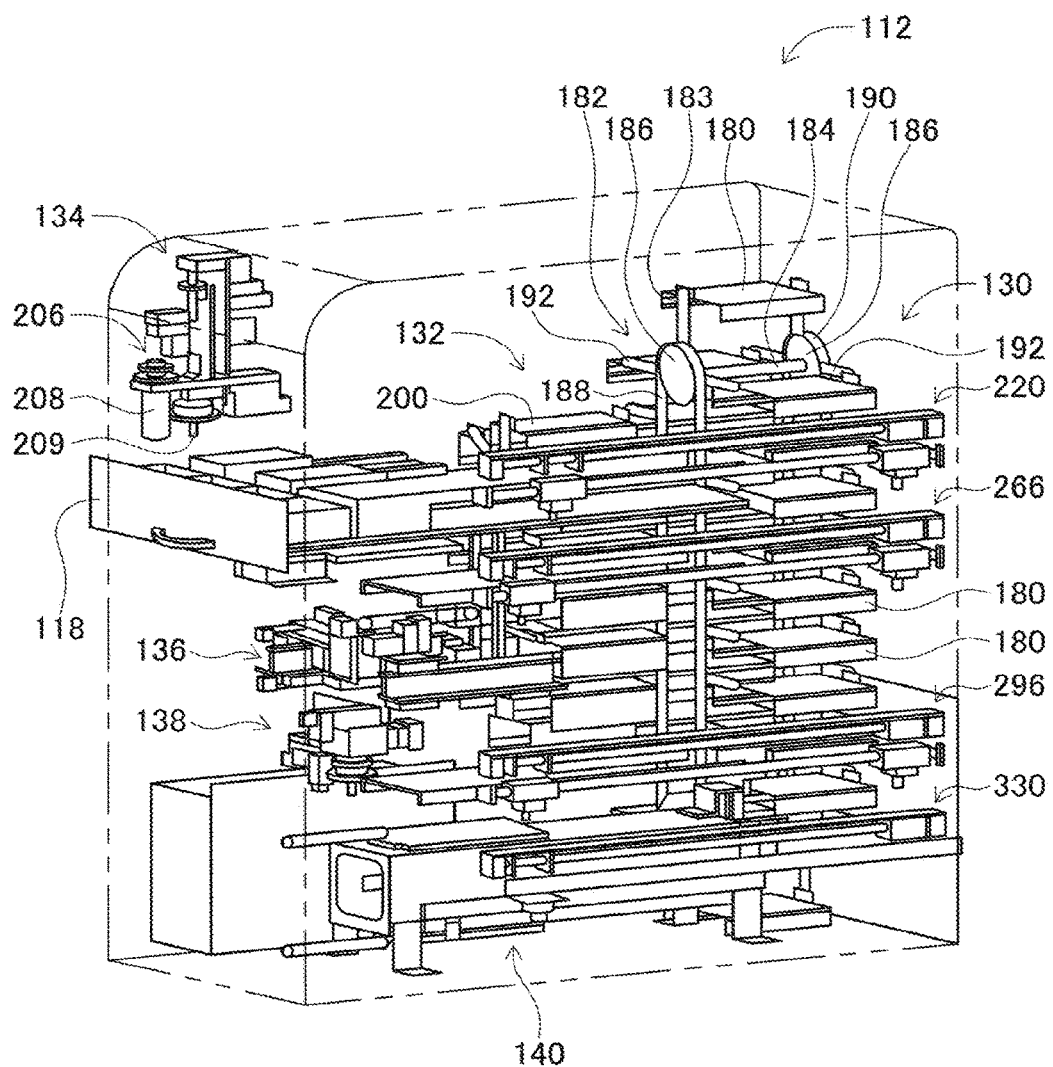

[FIG. 8]
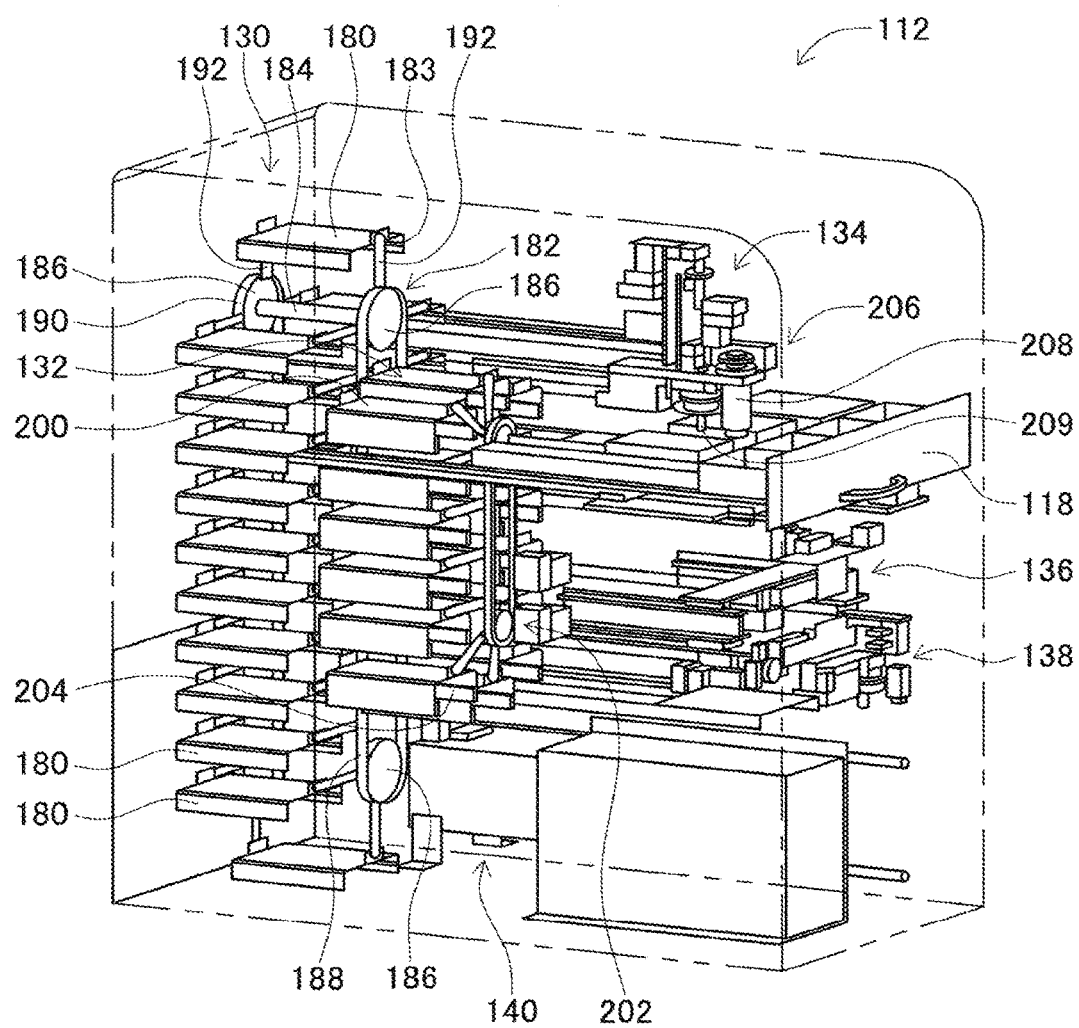

[FIG. 9]
(a)
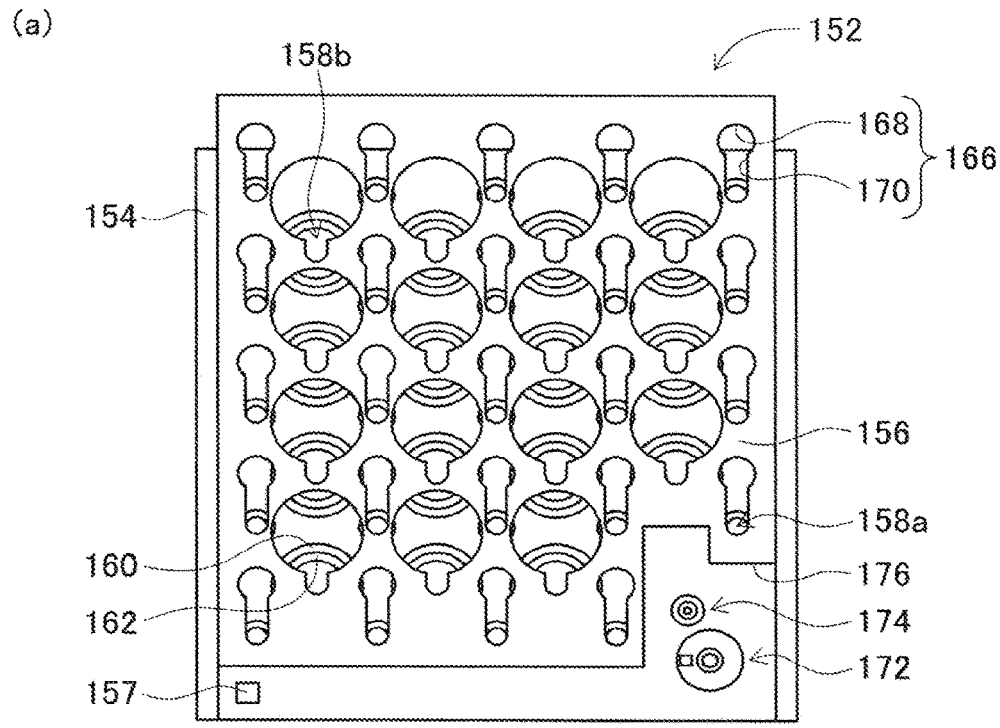
(b)
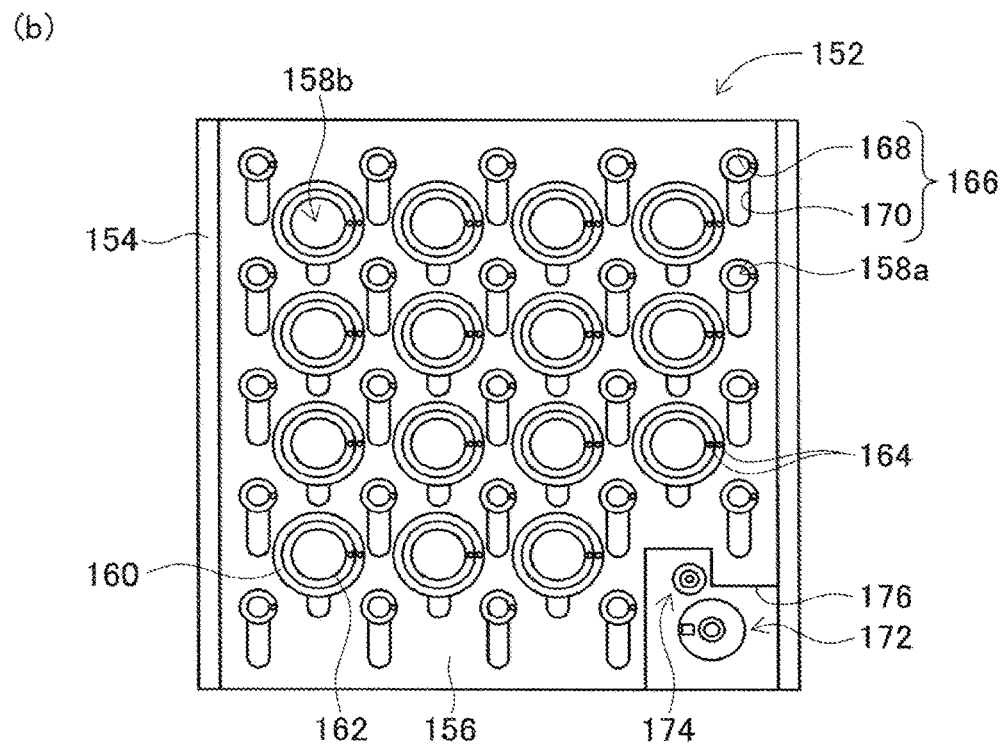

[FIG. 10]
(a)
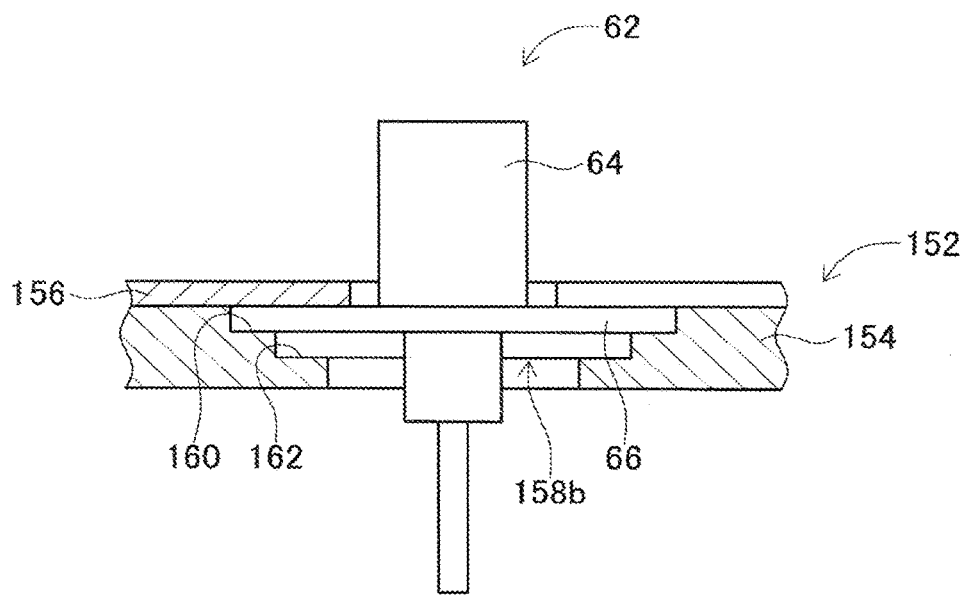
(b)
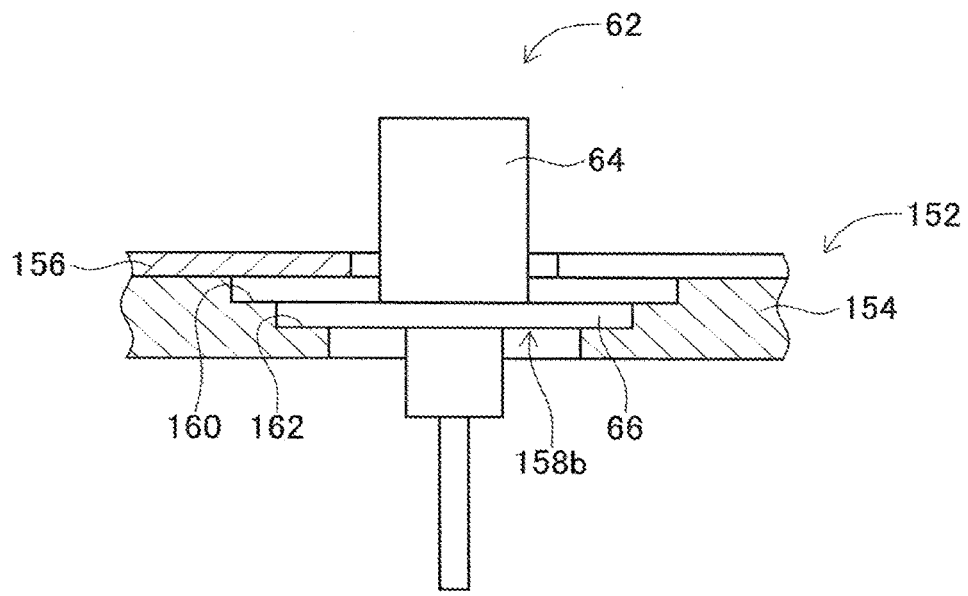

[FIG. 11]
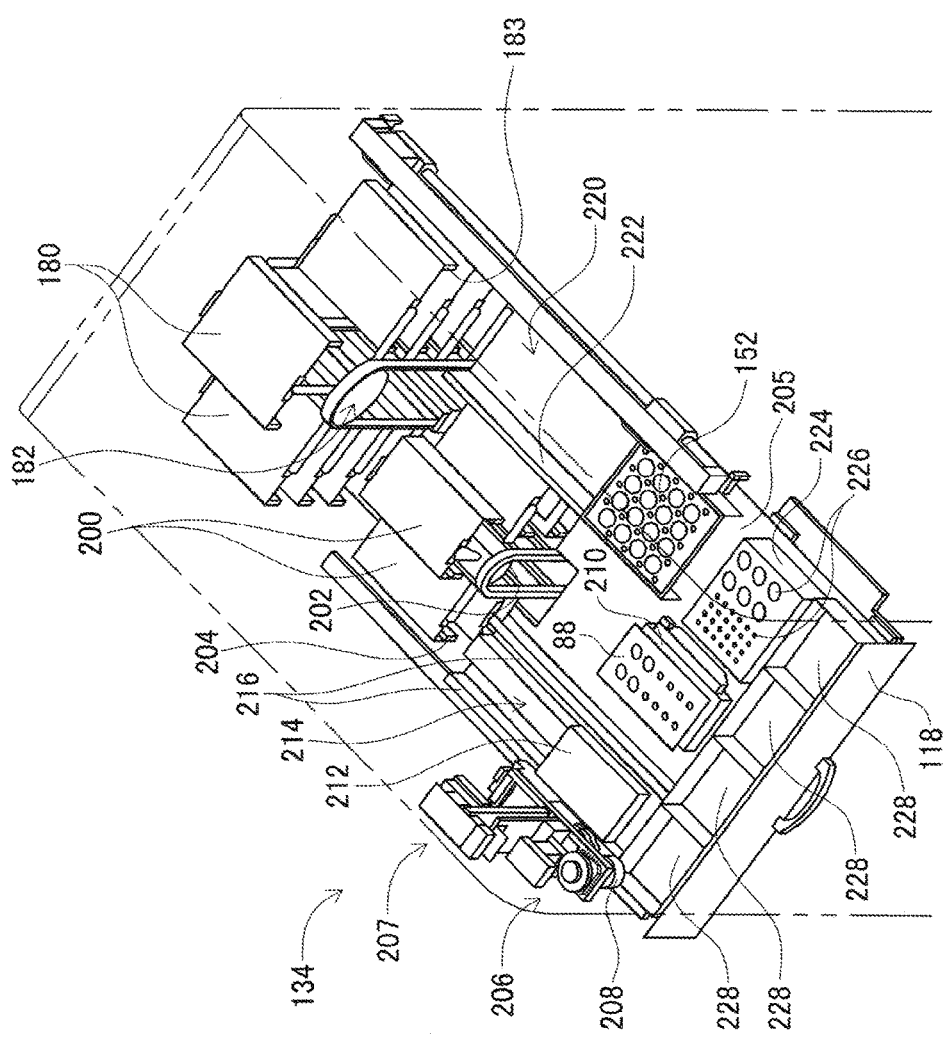

[FIG. 12]
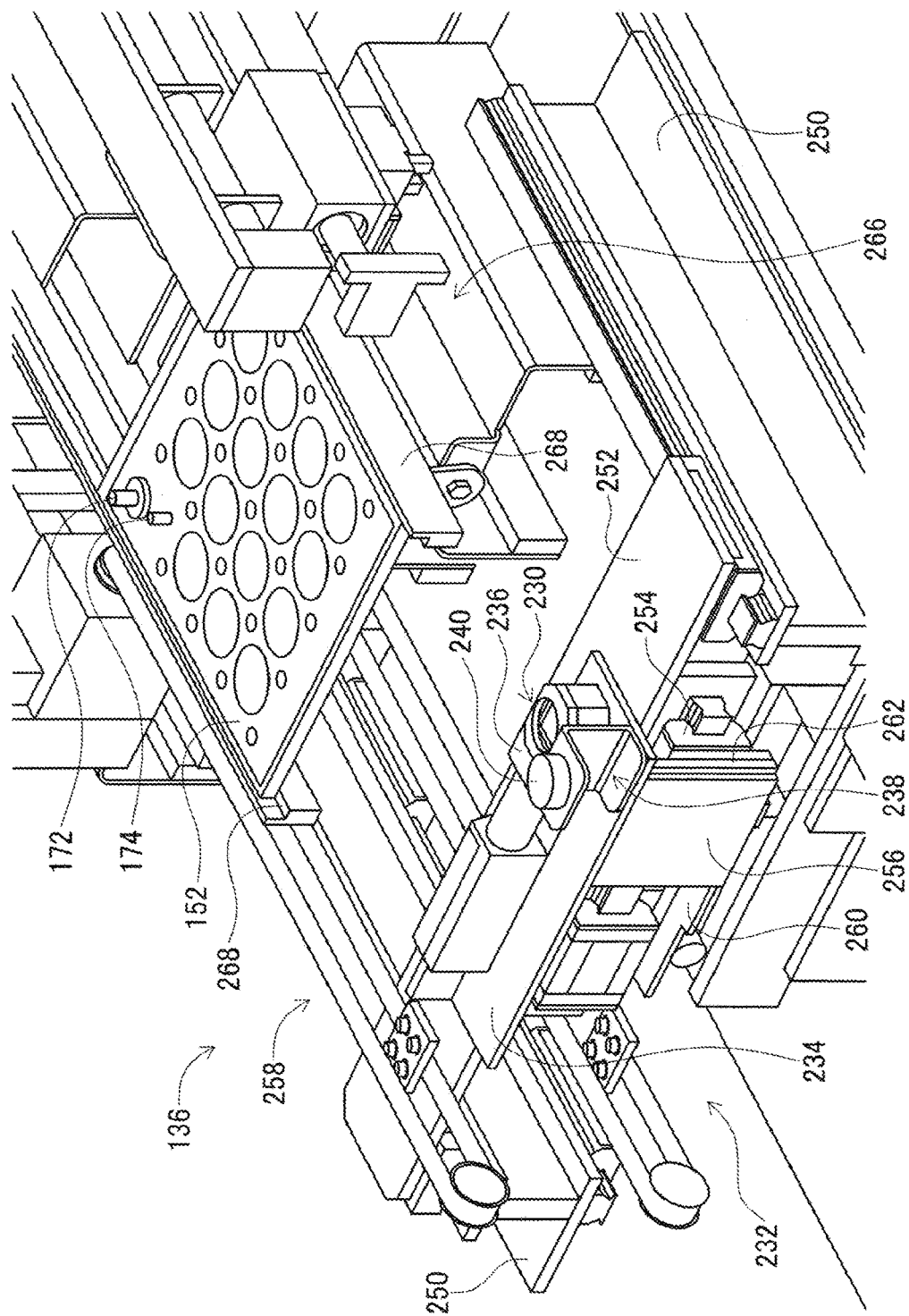

[FIG. 13]
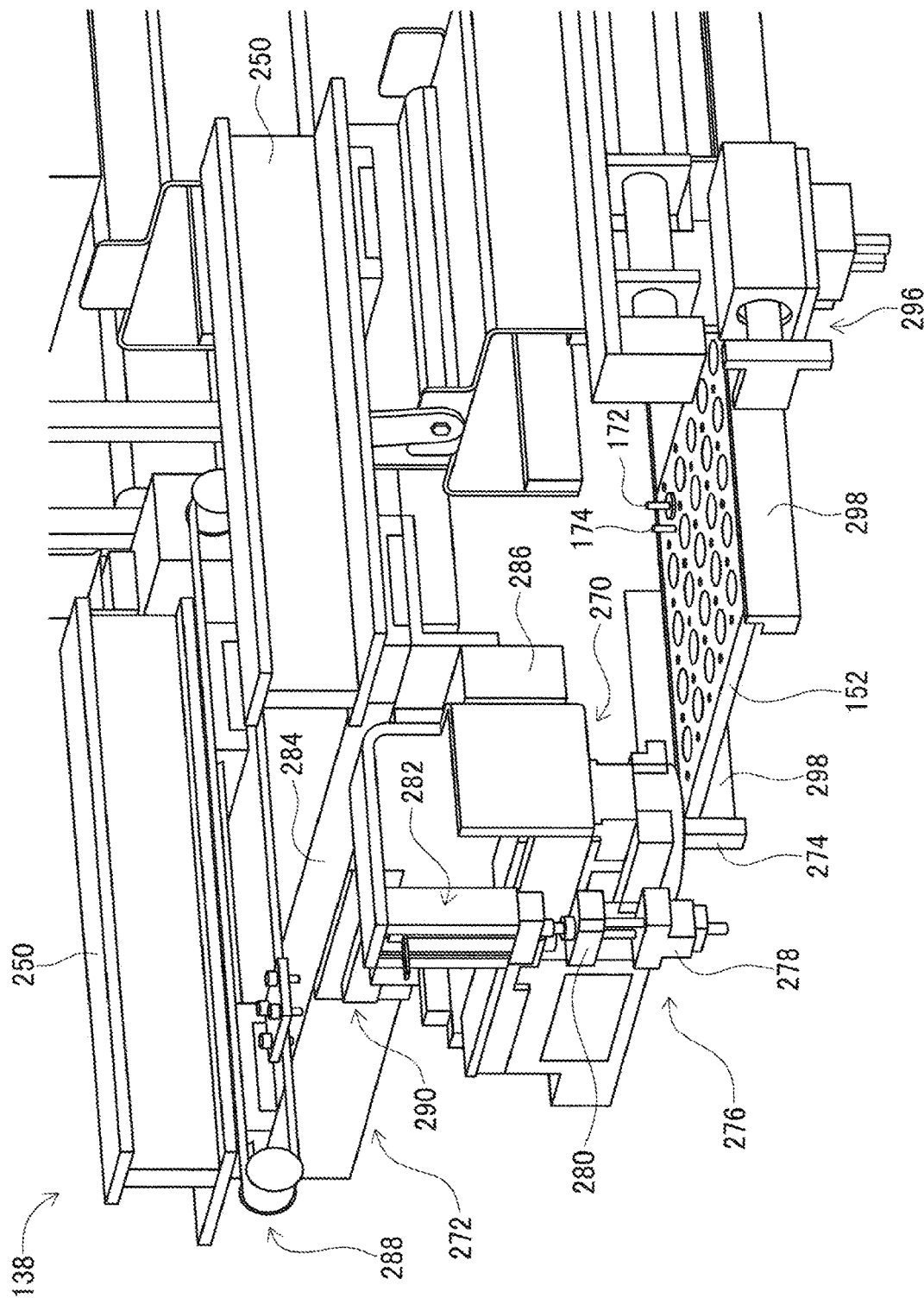

[FIG. 14]
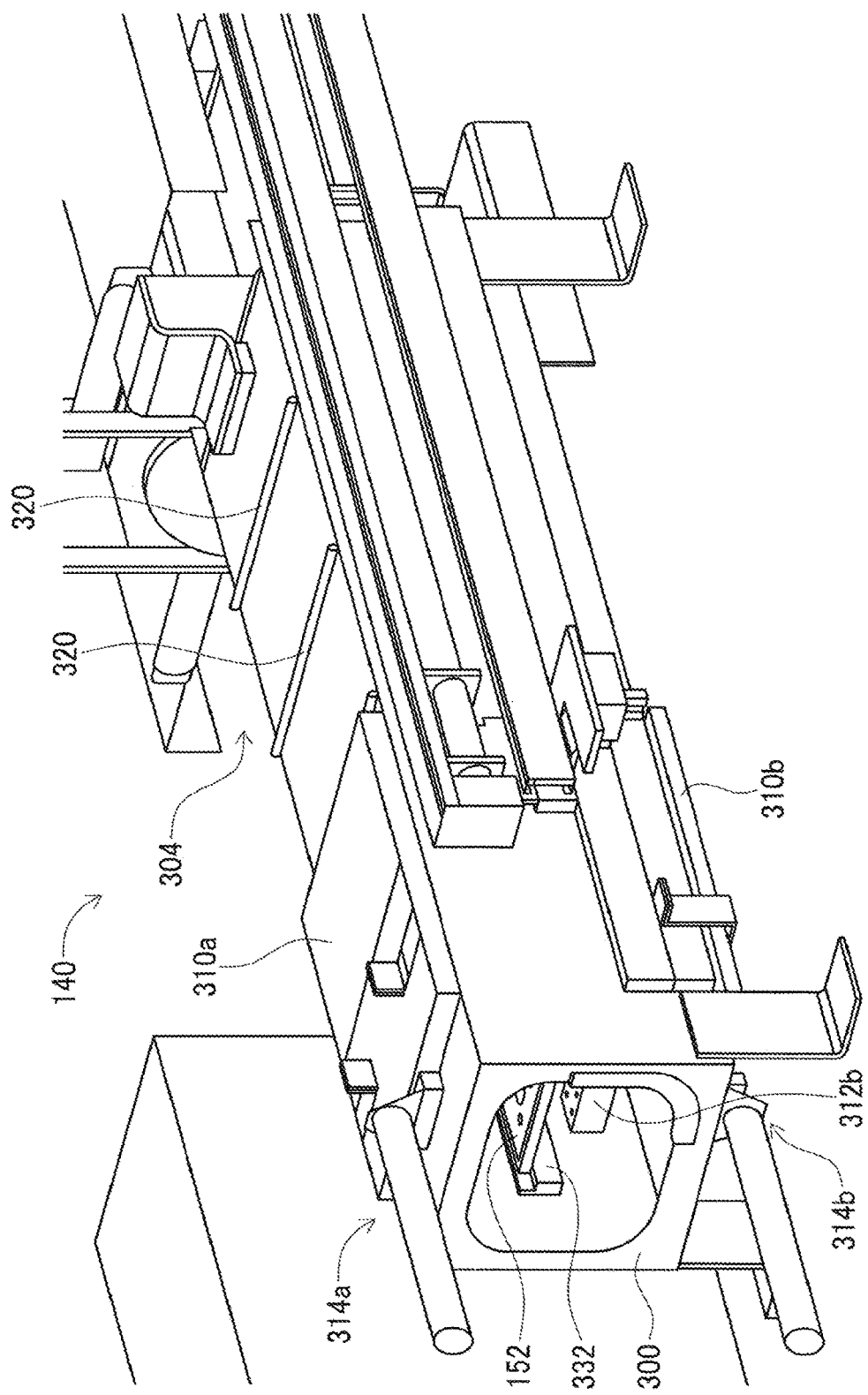

[FIG. 15]
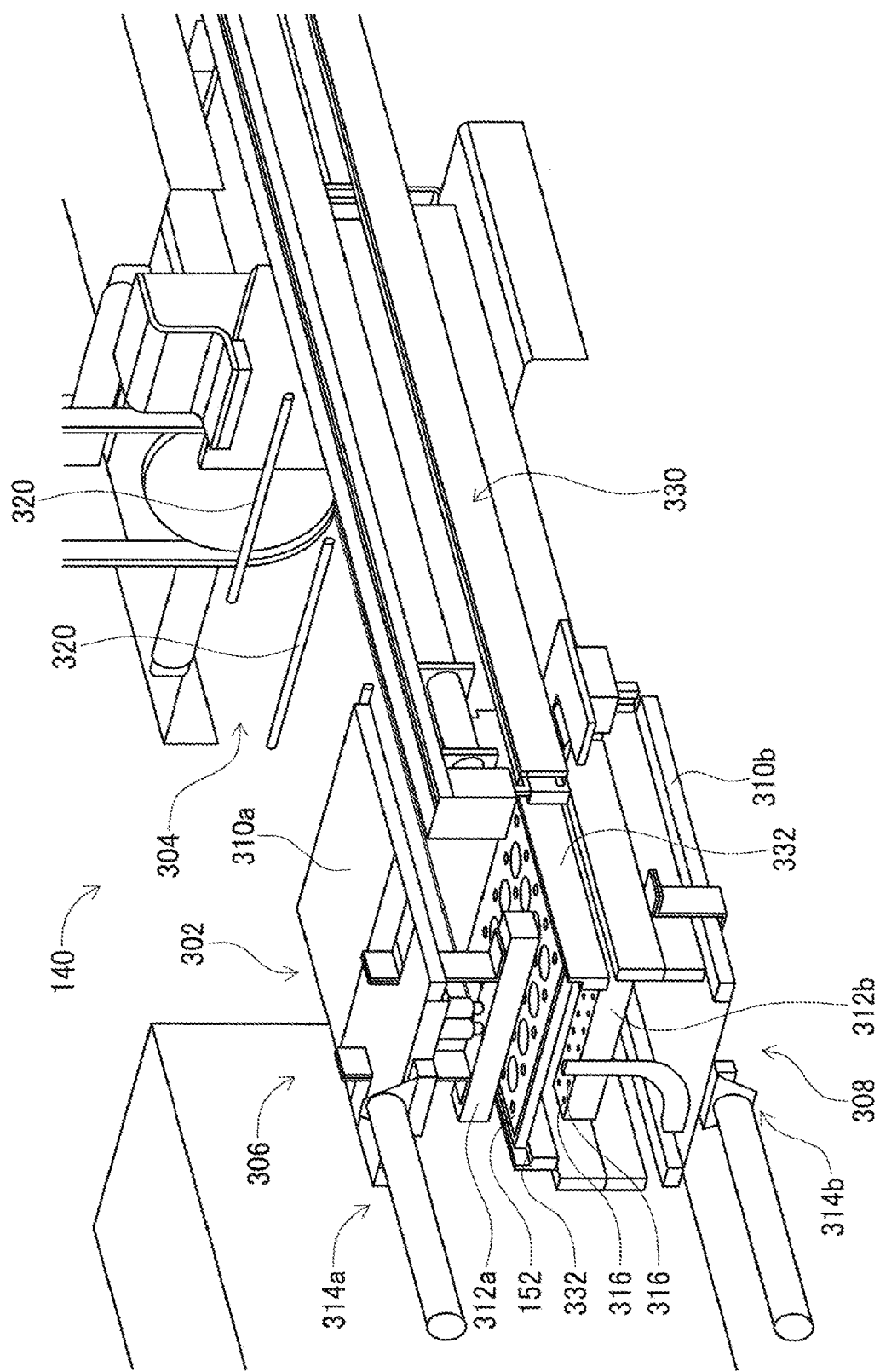

NOZZLE MANAGEMENT SYSTEM

TECHNICAL FIELD

The present disclosure relates to a nozzle management system configured from multiple nozzle housing devices comprising of a housing section that houses suction nozzles for picking up and holding electronic components, and a transfer mechanism that transfers a suction nozzle housed in the housing section to a nozzle tray.

BACKGROUND ART

Electronic component mounters pick up and hold an electronic component using a suction nozzle and mount the electronic component on a circuit board. For this, in the electronic component mounter, highly accurate mounting work must be maintained and using an appropriate suction nozzle is desirable. In order to use an appropriate suction nozzle, development is progressing of a device for cleaning suction nozzles, a device for performing inspection of suction nozzles, and the like; an example of such a device is given in the following patent literature.
Patent Literature 1: JP-A-2012-114237
Patent Literature 1: JP-A-2012-4306
Patent Literature 3: JP-A-2010-258185

SUMMARY

Problem to be Solved

With the purpose of using an appropriate suction nozzle, as disclosed in the above patent literature, it is desirable to use a device for cleaning suction nozzles, a device for performing inspection of suction nozzles, and the like. However, even if cleaning, inspection, and so on are performed, it is difficult to use an appropriate suction nozzle if management is not appropriate. For this, in recent years, development has progressed of a nozzle housing device configured from a housing section that houses suction nozzles for picking up and holding electronic components, and a transfer mechanism that transfers a suction nozzle housed in the housing section to a nozzle tray. According to this kind of nozzle housing device, suction nozzles can be appropriately stored in a housing section and any suction nozzle from the stored suction nozzles can be transferred to a nozzle tray, such that management of nozzles can be performed efficiently. Further, by providing multiple nozzle housing devices, management can be performed of a correspondingly large quantity of suction nozzles, such that usability is greatly improved. However, it is difficult to manage the type of suction nozzle stored in each respective multiple nozzle housing device, the housing location of any given suction nozzle, and so on, thus, the practicality of a nozzle management system provided with multiple suction nozzle housing devices could be considered to be improved by appropriately managing these items. The present disclosure considers the above-described problem and an object thereof is to provide a nozzle management machine with high practicality.

Means for Solving the Problem

A nozzle management system comprising: multiple nozzle housing devices which include a housing section that houses suction nozzles for picking up and holding an electronic component and a transfer mechanism for transferring a suction nozzle housed in the housing section to a nozzle tray; and a control device which includes a transfer information acquisition section that acquires information related to at least one suction nozzle which is required to be transferred to a nozzle tray; wherein the control device has a housed nozzle information acquisition section that acquires information related to suction nozzles housed in the housing section of the respective multiple nozzle housing devices, a first determination section that, when suction nozzles housed in the housing section of a prescribed nozzle housing device from among the multiple nozzle housing devices are transferred to a nozzle tray, determines whether all the required suction nozzles are housed in the housing section of the prescribed nozzle housing device based on information acquired by the transfer information acquisition device, and a second determination section that, in a case in which not all the required suction nozzles are housed in the housing section of the prescribed nozzle housing device, determines whether non-housed suction nozzles which are not stored in the housing section of the prescribed nozzle housing device from among the required suction nozzles are stored in the housing section of a nozzle housing device other than the prescribed nozzle housing device from among the multiple nozzle housing devices.

Effects

With a nozzle management system disclosed in this application, a control device stores information related to all suction nozzles housed in multiple nozzle housing devices. And, a control section determines whether all the required suction nozzles which should be transferred to a nozzle tray are stored in a prescribed nozzle storage device. Further, a control section determines whether, from among the required suction nozzles, non-housed suction nozzles that are not housed in the prescribed nozzle housing device are housed in another nozzle housing device. Thus, in a case in which all the required suction nozzles are stored in multiple nozzle housing devices, it is possible to gather all the required suction nozzles to be moved to a nozzle tray. Also, in a case in which not all the required suction nozzles are stored in multiple suction nozzle housing devices, the presence of non-housed suction nozzles can be recognized, and ordering or the like of non-housed suction nozzles can be performed. In this way, according to the disclosed nozzle management system, it is possible to perform appropriate management of the types of suction nozzles housed in each of the multiple nozzle housing devices, the housing location of any given suction nozzle, and the like, thus the practicality of a nozzle management system is improved.

BRIEF DESCRIPTION OF DRAWINGS

FIG. 1 is a perspective view showing an electronic circuit component mounting device that uses suction nozzles which are a target for management by the nozzle management system of an embodiment of the present disclosure.

FIG. 2 is a perspective view showing a mounting head which is provided on the electronic component mounting device.

FIG. 3 is a perspective view showing a nozzle which is a target for management by the nozzle management system of an embodiment of the present disclosure.

FIG. 4 is a plan view showing a nozzle tray on which suction nozzles are loaded in an electronic circuit component mounting device.

FIG. 5 is a cross-section of the nozzle tray shown in FIG. 4.

FIG. 6 is a diagram showing conceptually an embodiment of the nozzle management system of the present disclosure.

FIG. 7 is a perspective view showing the internal configuration of a nozzle management device that configures the nozzle management system as seen from the front-right.

FIG. 8 is a perspective view showing the internal configuration of a nozzle management device that configures the nozzle management system as seen from the front-left.

FIG. 9 is a plan view showing a nozzle pallet on which suction nozzles are loaded in the nozzle management device.

FIG. 10 is a cross-section of the nozzle pallet shown in FIG. 9.

FIG. 11 is a perspective view showing a nozzle transfer device provided in the nozzle management device.

FIG. 12 is a perspective view showing a first nozzle inspection device provided in the nozzle management device.

FIG. 13 is a perspective view showing a second nozzle inspection device provided in the nozzle management device.

FIG. 14 is a perspective view showing a nozzle cleaning device provided in the nozzle management device.

FIG. 15 is a perspective view showing the nozzle cleaning device in a state with housing removed.

DESCRIPTION OF EMBODIMENT

The following describes in detail referring to the figures an example embodiment of the present disclosure.
Configuration of Electronic Component Mounting Device An electronic component mounting device (hereinafter in some cases abbreviated to "mounting device") 10 is shown in FIG. 1. Mounting device 10 includes one system base 12, and two electronic component mounters (hereinafter in some cases abbreviated to "mounter") 14 provided adjacently to each other on the system base 12. Note that, the direction in which the mounters 14 are lined up is referred to as the X-axis direction, and the horizontal direction which is perpendicular to the X-axis direction is referred to as the Y-axis direction.

Each mounter 14 is provided mainly with mounter body 20, conveyance device 22, mounting head moving device (hereinafter in some cases abbreviated to "moving device") 24, mounting head 26, supply device 28, and nozzle station 30. Mounter body 20 is configured from frame 32 and beam 34 that is mounted on the frame 32.

Conveyance device 22 is provided with two conveyor devices 40 and 42. The two conveyor devices 40 and 42 are parallel to each other and are provided on frame 32 extending in the X-axis direction. Each of the two conveyor devices 40 and 42 conveys a circuit board held on the respective conveyor devices 40 and 42 in the X-axis direction using an electromagnetic motor (not shown). Also, the circuit board is fixedly held at a predetermined position by a board holding device (not shown).

Moving device 24 is an XY robot type moving device. Moving device 24 is provided with an electromagnetic motor (not shown) that slides a slider 50 in the X-axis direction, and an electromagnetic motor (not shown) that slides slider 50 in the Y-axis direction. Mounting head 26 is attached to slider 50, and the mounting head 26 is moved to any position on frame 32 by the operation of the two electromagnetic motors 52 and 54.

Mounting head 26 mounts electronic components on a circuit board. As shown in FIG. 2, mounting head 26 includes multiple rod-shaped mounting units 60; a suction nozzle 62 is attached to the lower end of each of the multiple mounting units 60. As shown in FIG. 3, suction nozzle 62 is configured from body pipe 64, flange 66, suction tube 68, and locking pin 70. Body pipe 64 is cylindrical and flange 66 is fixed to the outer surface of body pipe 64 so as to project outwards. Suction tube 68 is a thin pipe that extends downwards from the lower end of body pipe 64. A spring (not shown) in a compressed state is provided between suction tube 68 and body pipe 64; suction tube 68 is biased in a direction extending downwards from the lower end of body pipe 64 by the elastic force of the spring. In other words, by applying a force to the tip of suction tube 68 against the biasing force of the spring, suction tube 68 retreats inside body pipe 64. Also, locking pin 70 is provided on an upper section of body pipe 64 such that locking pin 70 extends in the diameter direction of body pipe 64. Suction nozzle 62 is attached to the lower end of mounting unit 60 using locking pin 70 such that suction nozzle 62 is attachable/detachable with one touch. The method of attachment of suction nozzle 62 to mounting unit 60 using locking pin 70 is well known, so descriptions are omitted. Also, a cutout 72 is formed in the outer edge of flange 66 and 2D code 74 is provided on the upper surface of flange 66. Note that 2D code 74 is an identification symbol for identifying characteristic information of suction nozzle 62.

Body pipe 64 of suction nozzle 62 is connected to a positive/negative pressure supply device (not shown) via a negative pressure air and positive pressure air passage. Thus, the tip of suction tube 68 of suction nozzle 62 picks up and holds an electronic component using negative pressure, and releases the held electronic component using positive pressure. As shown in FIG. 2, rod-shaped mounting units 60 are held on the outer surface of unit holding body 76 at a pitch of equal angles such that the axis direction of the mounting units 60 is vertical. And, each suction nozzle 62 extends downwards from the bottom surface of unit holding body 76.

Also, unit holding body 76 is intermittently rotated by equal angle increments at the arrangement angle pitch of mounting units 60 by a holding body rotating device 78. Thus, the multiple mounting units 60 are stopped successively at a raising/lowering station which is one of the stopping positions of the mounting units 60. A mounting unit 60 that has stopped at the raising/lowering station is raised/lowered by a unit raising/lowering device 80. Also, a mounting unit 60 that has stopped at the raising/lowering station is rotated about its own axis by a unit rotating device 82.

Supply device 28 is a feeder type supply device and, as shown in FIG. 1, is provided on the front end of frame 32. Supply device 28 has tape feeders 86. Tape feeder 86 houses taped components in a wound state. Taped components are electronic components that have been put into tape. And, tape feeder 86 feeds taped components using a feeding device (not shown). Accordingly, feeder type supply device 28 supplies an electronic component to a supply position through the feeding delivery of the taped components.

Nozzle station 30 is for storing multiple suction nozzles 62 and has a nozzle tray 88. As shown in FIG. 4, nozzle tray 88 has base plate 90 and cover plate 92; cover plate 92 is slidably provided on base plate 90. Note that, base plate 90 and cover plate 92 have roughly the same dimensions, and when cover plate 92 is slid with respect to base plate 90 (a state shown in FIG. 4[a]), 2D code 94 provided at an end of base plate 90 is exposed. Conversely, when cover plate 92 entirely overlaps base plate 90 (a state shown in FIG. 4[b]), 2D code 94 is covered by cover plate 92. Note that, 2D code 94 is an identification symbol for identifying characteristic information of nozzle tray 88.

As shown in FIG. 4 and FIG. 5 that is a cross-section of nozzle tray 88, multiple loading holes 96 are formed in base plate 90. Loading hole 96 is a stepped through-hole into which a suction nozzle 62 can be loaded. In detail, the internal diameter of stepped surface 98 of stepped through-hole 96 is slightly larger than the outer diameter of flange 66 of suction nozzle 62, and as shown in FIG. 5(b), flange 66 of suction nozzle 62 is loaded on the stepped surface 98. Also, pin (refer to FIG. 4[b]) 100 is provided on stepped surface 98 and cutout 72 of flange 66 engages with the pin 100. Thus, suction nozzle 62 loaded in loading hole 96 is prohibited from being rotated around its own axis. Note that, for loading holes 96, there are loading holes 96a with a small diameter and loading holes 96b with a large diameter; a small suction nozzle 62 is loaded in a loading hole 96a with a small diameter, and a large suction nozzle 62 is loaded in a loading hole 96b with a large diameter.

Also, holes 102 are formed in cover plate 92 to correspond to the multiple loading holes 96 of base plate 90. Hole 102 is configured from circular hole section 104 and slot section 106. Circular hole section 104 is circular with an internal diameter slightly larger than stepped surface 98 of the corresponding loading hole 96. Also, slot section 106 is a portion which forms a cutout in the edge of circular hole section 104, and is a cutout section that is slightly larger than the outer diameter of body pipe 64 of suction nozzle 62.

With nozzle tray 88 with the configuration given above, by sliding cover plate 92 with respect to base plate 90, it is possible to switch between a state in which, as shown in FIG. 4(a), loading hole 96 is partially exposed via hole 102 (hereinafter referred to as "partially exposed state"), and a state in which, as shown in FIG. 4(b), hole 96 is entirely exposed via hole 102 (hereinafter referred to as "entirely exposed state").

In detail, in the entirely exposed state, as shown in FIG. 4(b), the center of loading hole 96 and the center of circular hole section 104 of hole 102 are aligned such that stepped surface 98 of loading hole 96 is fully exposed. Thus, in the entirely exposed state, it is possible to load a suction nozzle 62 in loading hole 96, and to remove a suction nozzle 62 from loading hole 96. In other words, in the entirely exposed state, it is possible to house suction nozzles 62 in nozzle tray 88, and to remove suction nozzles 62 from nozzle tray 88.

Conversely, in the partially exposed state, as shown in FIG. 4(a), the center of loading hole 96 and the center of circular hole section 104 of hole 102 are not aligned, such that a portion of stepped surface 98 of loading hole 96 is covered by cover plate 92. Thus, in the partially exposed state, it is not possible to load a suction nozzle 62 in loading hole 96, or to remove a suction nozzle 62 from loading hole 96. In other words, in the partially exposed state, it is not possible to house suction nozzles 62 in nozzle tray 88, or to remove suction nozzles 62 from nozzle tray 88. However, in the partially exposed state, the center of loading hole 96 and the center of slot section 106 of hole 102 are aligned, and as shown in FIG. 5(b), body pipe 64 of suction nozzle 62 loaded in loading hole 96 extends above cover plate 92 from slot section 106.

Also, cover plate 92 can be slid with respect to base plate 90 between the entirely exposed state and the partially exposed state, and is biased in the direction of the partially exposed state by a spring (not shown). In other words, usually, the housing of suction nozzles 62 into nozzle tray 88 and the removal of suction nozzles 62 from nozzle tray 88 is prohibited. However, nozzle station 30 has a plate moving mechanism (not shown) that slides cover plate 92 against the elastic force of the spring in the direction leading to the entirely exposed state, and by cover plate 92 being slid by the operation of the plate moving mechanism, the housing of suction nozzles 62 into nozzle tray 88, and the removal of suction nozzles 62 from nozzle tray 88, are allowed. Note that, nozzle tray 88 is attachable/detachable to/from nozzle station 30 such that the collection of suction nozzles 62 housed in nozzle station 30, or the replenishment of suction nozzles 62 to nozzle station 30, and the like, can be performed outside mounter 14.

Mounting Work by a Mounter

It is possible to perform mounting work, with respect to a circuit board held in conveyance device 22, using a 26 mounting head in a mounter 14 with the above configuration. Specifically, based on commands of a control device (not shown) of mounter 14, a circuit board is conveyed to a work position, and the circuit board is fixedly held at that position by a board holding device. Also, based on commands of the control device, tape feeder 86 feeds taped components and supplies an electronic component to a supply position. Then, mounting head 26 moves above the supply position of the electronic component and picks up and holds the electronic component using suction nozzle 62. Continuing, mounting head 26 moves above the circuit board and mounts the held electronic component on the circuit board.

Exchange of Suction Nozzles in a Nozzle Station

In mounter 14, as given above, an electronic component supplied by tape feeder 86 is picked up and held by suction nozzle 62 and then mounted on the circuit board. In mounter 14 configured in this way, suction nozzles 62 are changed according to the size, type, and so on of the electronic components. In other words, for example, when picking up and holding a large electronic component, a suction nozzle 62 with a large diameter is used; when picking up and holding a small electronic component, a suction nozzle 62 with a small diameter is used. Thus, according to the type of circuit board to be manufactured, it is required to use various types of suction nozzles 62, such that various types of suction nozzles 62 are housed in nozzle station 30 according to the type of circuit board to be manufactured. Thus, exchange and so on is performed as necessary between suction nozzles 62 attached to mounting units 60 of mounting head 26 and suction nozzles 62 housed in nozzle station 30. Note that, methods of exchange and so on between suction nozzles 62 attached to mounting units 60 of mounting head 26 and suction nozzles 62 housed in nozzle station 30 are well known, so descriptions are omitted.

As given above, various types of suction nozzles 62 are housed in nozzle station 30 according to the type of circuit board to be manufactured. Thus, for example, when the type of circuit board being manufactured is changed, nozzle tray 88 is removed from nozzle station 30, and suction nozzles 62 housed in nozzle tray 88 are exchanged using a nozzle management system. The nozzle management system is described in detail below.

Configuration of Nozzle Management System

As shown in FIG. 6, nozzle management system 110 includes multiple nozzle management devices 112 and control device 114. Control device 114 is connected to each of the multiple nozzle management devices 112 via cable 116 such that sending and receiving of information can be performed. Each nozzle management device 112 is largely a rectangular cuboid and a drawer 118 for storing a nozzle tray 88 inside nozzle management device 112, and for removing a nozzle tray 88 from nozzle management device 112, is provided on the front surface of nozzle management device 112. Panel 120 for displaying various information, operation switches 122 for performing inputting of information, and the like, are provided above drawer 118.

As shown in FIG. 7 and FIG. 8, each nozzle management device 112 includes a pallet housing device 130, a tray housing device 132, a nozzle transfer device 134, a first nozzle inspection device 136, a second nozzle inspection device 138, and a nozzle cleaning device 140. Note that, FIG. 7 is a perspective view showing the internal configuration of nozzle management device 112 as seen from the front-right of nozzle management device 112; FIG. 8 is a perspective view showing the internal configuration of nozzle management device 112 as seen from the front-left of nozzle management device 112.

(a) Pallet Housing Device

Pallet housing device 130 is for housing nozzle pallets 152 shown in FIG. 9. In the same way as nozzle tray 88, a nozzle pallet 152 has a base plate 154 and a cover plate 156; cover plate 156 is slidably provided on base plate 154. Base plate 154 and cover plate 156 have roughly the same dimensions, and when cover plate 156 is slid with respect to base plate 154 (a state shown in FIG. 9[a]), 2D code 157 provided at an end of base plate 154 is exposed. Conversely, when cover plate 156 entirely overlaps base plate 154 (a state shown in FIG. 9[b]), 2D code 157 is covered by cover plate 156. Note that, 2D code 157 is an identification symbol for identifying characteristic information of nozzle pallet 152.

Also, reference nozzle 172 and reference pipe 174 are provided at a corner section of base plate 154. Reference nozzle 172 and reference pipe 174 penetrate base plate 154, and the lower end of reference nozzle 172 and reference pipe 174 extend below base plate 154. Note that, cutout 176 is formed at a corner section of cover plate 156, such that reference nozzle 172 and reference pipe 174 are exposed even in a state in which cover plate 156 entirely overlaps base plate 154.

Multiple loading holes 158 are formed in base plate 154, and as these multiple loading holes 158, there are loading holes 158a with a small diameter and loading holes 158b with a large diameter. Loading holes 158a with a small diameter are the same shape as loading holes 96a with a small diameter of nozzle tray 88, and a suction nozzle 62 that can be loaded in a loading hole 96a is loaded into a loading hole 158a. On the other hand, loading holes 158b with a large diameter have roughly the same shape as loading holes 96b with a large diameter of nozzle tray 88, but, as shown in FIG. 9 and FIG. 10 that is a cross-section of nozzle pallet 152, loading holes 158b are stepped holes with two stepped surfaces 160 and 162. The internal diameter of first stepped surface 160 is the same as the internal diameter of loading hole 96b with a large diameter of nozzle tray 88, and as shown in FIG. 10(a), a suction nozzle 62 that can be loaded in a loading hole 96b is loaded onto first stepped surface 160. The internal diameter of second stepped surface 162 is smaller than the internal diameter of first stepped surface 160, and as shown in FIG. 10(b), a suction nozzle 62 that is smaller than a suction nozzle 62 which can be loaded onto first stepped surface 160 is loaded onto second stepped surface 162. Note that, pin (refer to FIG. 9[b]) 164 is provided on each of stepped surfaces 160 and 162, and pin 164 engages with cutout 72 of flange 66 of suction nozzle 62.

Also, holes 166 are formed in cover plate 156 to correspond to the multiple loading holes 158 of base plate 154. Hole 166 is the same shape as hole 102 of nozzle tray 88 and is configured from circular hole section 168 and slot section 170. Thus, in the same way as with nozzle tray 88, switching between a partially exposed state and an entirely exposed state is possible with nozzle pallet 152.

In detail, in the entirely exposed state, as shown in FIG. 9(b), stepped surface 160 and the like of loading hole 158 is fully exposed, and it is possible to load a suction nozzle 62 in loading hole 158, and to remove a suction nozzle 62 from loading hole 158. On the other hand, in the partially exposed state, as shown in FIG. 9(a), a portion of stepped surface 160 and the like of loading hole 158 is covered by cover plate 156, and it is not possible to load a suction nozzle 62 in loading hole 158, or to remove a suction nozzle 62 from loading hole 158. However, in the partially exposed state, as shown in FIG. 10, body pipe 64 of suction nozzle 62 loaded in loading hole 158 extends above cover plate 156 from slot section 170.

Also, cover plate 156 can be slid with respect to base plate 154 between the entirely exposed state and the partially exposed state, and is biased in the direction of the partially exposed state by a spring (not shown). Thus, usually, the housing of suction nozzles 62 into nozzle pallet 152 and the removal of suction nozzles 62 from nozzle pallet 152 is prohibited. However, in the same way as for nozzle tray 88, by sliding cover plate 156 against the elastic force of the spring in the direction leading to the entirely exposed state, the housing of suction nozzles 62 into nozzle pallet 152, and the removal of suction nozzles 62 from nozzle pallet 152, are allowed.

Pallet housing device 130 is for housing nozzle pallets 152 with the above configuration. As shown in FIG. 7 and FIG. 8, pallet housing device 130 has multiple pallet carriers 180 and a carrier circulating mechanism 182. Pallet carrier 180 has the shape of a channel, that is, the cross-section of pallet carrier 180 forms a U-shape, and pallet carrier 180 is provided such that the opening of the channel shape faces downwards. Rails 183 are formed on internal surfaces of pallet carrier 180, and a nozzle pallet 152 is held by the rails 183. Note that, a nozzle pallet 152 is loaded on a pallet carrier 180 by being inserted from the front of the pallet carrier 180; a nozzle pallet 152 is removed from a pallet carrier 180 by being pulled forwards.

Carrier circulating mechanism 182 has a pair of sprocket axes 184; the pair of sprocket axes 184 are provided at the top and bottom extending in a front/rear direction. A sprocket 186 is attached at each end of each sprocket axis 184. The front sprockets 186 of the pair of sprocket axes 184 are linked to each other by a chain 188; the rear sprockets 186 of the pair of sprocket axes 184 are linked to each other by a chain 190.

Multiple brackets 192 are attached to chains 188 and 190 and each bracket 192 extends outwards perpendicularly from chain 188 or 190. A pallet carrier 180 is rotatably attached to an end of a bracket 192 attached to chain 188 and an end of a bracket 192 attached to chain 190. Sprocket axes 184 are controllably rotated by the driving of an electromagnetic motor (not shown). According to this kind of configuration, multiple pallet carriers 180, that is, nozzle pallets 152 held on pallet carriers 180, are circulated in an up/down direction inside nozzle management device 112 by carrier circulating mechanism 182. Note that, during circulating, pallet carriers 180 are always maintained in a state in which the opening of the channel shape is facing downwards, thus nozzle pallets 152 held in pallet carriers 180 are circulated always in a horizontal state.

(b) Tray Housing Device

Tray housing device 132 is for housing nozzle trays 88 and is provided in front of pallet housing device 130. Tray housing device 132 has multiple tray carriers 200 and a carrier circulating mechanism 202. Tray carrier 200, in the same way as pallet carrier 180, has the shape of a channel, and tray carrier 200 is provided such that the opening of the channel shape faces downwards. Also, nozzle tray 88 is stored in tray carrier 200 by rails 204 formed on internal surfaces of tray carrier 200. Note that, a nozzle tray 88 is loaded on a tray carrier 200 by being inserted from the front of the tray carrier 200; a nozzle tray 88 is removed from a tray carrier 200 by being pulled forwards.

Carrier circulating mechanism 202, in the same way as carrier circulating mechanism 182, has sprocket axes, sprockets, chains, brackets (symbols omitted), and the like, and operates in the same way as carrier circulating mechanism 182. Thus, multiple tray carriers 200, that is, nozzle trays 88 held on tray carriers 200, are circulated in an up/down direction inside nozzle management device 112 by carrier circulating mechanism 202. Note that, during circulating, tray carriers 200 are always maintained in a state in which the opening of the channel shape is facing downwards, thus nozzle trays 88 held in tray carriers 200 are circulated always in a horizontal state.

(c) Nozzle Transfer Device

Nozzle transfer device 134 is for transferring suction nozzles 62 between a nozzle tray 88 and a nozzle pallet 152, and as shown in FIG. 11, is provided on table 205 inside drawer 118. Nozzle transfer device 134 has a transfer head 206 and a head moving device 207. Camera 208 facing downwards and holding chuck (refer to FIG. 7 and FIG. 8) 209 for holding a suction nozzle 62 are provided on a lower surface of transfer head 206. Also, head moving device 207 is an XYZ-type moving device that moves transfer head 206 forwards/backwards, left/right, and up/down above table 205.

Also, fixed stage 210 and movable stage 212 for setting nozzle tray 88 are provided on table 205 inside drawer 118. Fixed stage 210 is fixed to table 205. On the other hand, movable stage 212 is slid backwards/forwards by stage moving mechanism 214. Stage moving mechanism 214 includes rails 216 provided on table 205 extending in a front/rear direction, and controllably slides movable stage 212 along rails 216. The rear end of rails 216 links with rails 204 of tray carrier 200 circulated to a specified position by carrier circulating mechanism 202. Thus, by sliding movable stage 212, it is possible to house a nozzle tray 88 set on movable stage 212 in tray carrier 200, and to set a nozzle tray 88 housed in tray carrier 200 on movable stage 212.

Also, a plate moving mechanism (not shown) for moving cover plate 92 in the direction leading to the entirely exposed state with respect to the set nozzle tray 88 is provided on fixed stage 210 and movable stage 212. Note that, in the diagram, a nozzle tray 88 is shown set on fixed stage 210.

Also, first pallet moving mechanism 220 for moving nozzle pallet 152 between a pallet carrier 180 circulated to a specified position by carrier circulating mechanism 182 and a position at which transfer of suction nozzles by nozzle transfer device 134 is possible (hereinafter sometimes referred to as "nozzle transfer position") is provided on table 205 inside drawer 118. First pallet moving mechanism 220 includes rails 222 provided on table 205 extending in a front/rear direction, and controllably slides nozzle pallet 152 along rails 222. The rear end of rails 222 links with rails 183 of pallet carrier 180 circulated to a specified position by carrier circulating mechanism 182. Thus, it is possible to move nozzle pallet 152 between a pallet carrier 180 circulated to a specified position by carrier circulating mechanism 182 and the nozzle transfer position. Note that, in the diagram, a nozzle pallet 152 is shown moved to the nozzle transfer position.

Transfer plate 224 is provided in front of nozzle pallet 152 moved to the nozzle transfer position. Multiple loading holes 226 with the same shape as loading holes 158 formed in base plate 154 of nozzle pallet 152 are formed in transfer plate 224. In the same way as loading holes 158, for multiple loading holes 226, there are loading holes 226 with a large diameter and loading holes 226 with a small diameter such that suction nozzle 62 of various sizes can be loaded. Also, discard box 228 is provided on the front section of table 205 inside drawer 118. Discard box 228 is divided into four spaces and suction nozzles which have been determined to be abnormal, that is defective nozzles, are divided and discarded into the four spaces.

When suction nozzles 62 are transferred between a nozzle tray 88 and a nozzle pallet 152 by nozzle transfer device 134 with the above configuration, nozzle pallet 152 is moved to the nozzle transfer position by first pallet moving mechanism 220, and nozzle tray 88 is set on fixed stage 210 or movable stage 212. Note that, when nozzle tray 88 is set on movable stage 212, an operator may set nozzle tray 88 on movable stage 212, or a nozzle tray 88 housed in tray carrier 200 may be set on movable stage 212 by stage moving mechanism 214.

Next, nozzle pallet 152 moved to the nozzle transfer position and nozzle tray 88 set on fixed stage 210 or movable stage 212 are made into the fully exposed state by a plate moving mechanism. Continuing, transfer head 206 is moved above nozzle tray 88 and nozzle pallet 152 by the operation of head moving device 207, and each 2D code 94 and 157 on nozzle tray 88 and nozzle pallet 152 is imaged by camera 208. Thus, characteristic information such as an ID number of nozzle tray 88 and nozzle pallet 152 is obtained.

Continuing, transfer head 206 moves above nozzle tray 88 or nozzle pallet 152 which is the transfer origin of a suction nozzle 62 and 2D code 74 of the suction nozzle 62 which is the transfer target is imaged by camera 208. By this, characteristic information such as an ID number of suction nozzle 62 which is the transfer target is obtained. Then, suction nozzle 62 which is the transfer target is held by holding chuck 209.

When suction nozzle 62 which is the transfer target is held by holding chuck 209, transfer head 206 moves above nozzle tray 88 or nozzle pallet 152 which is the transfer destination of suction nozzle 62 by the operation of head moving device 207, and suction nozzle 62 which is held is transferred to a loading hole 96 or 158 of nozzle tray 88 or nozzle pallet 152. Thus, suction nozzle 62 is transferred between nozzle tray 88 and nozzle pallet 152. Note that, during transfer of suction nozzle 62, a link between the ID number of nozzle tray 88 or nozzle pallet 152 which is the transfer destination, the ID number of the transferred suction nozzle 62, and the loading position in the nozzle tray 88 or nozzle pallet 152 is created and stored.

Also, when suction nozzle 62 is transferred, if there are no empty loading holes 96 and 158 in the transfer destination nozzle tray 88 or nozzle pallet 152, that is a suction nozzle 62 has been loaded in all the loading holes 96 and 158, the holding chuck 209 which is holding a suction nozzle 62 is moved above transfer plate 224, and by the operation of head moving device 207, suction nozzle 62 is provisionally loaded in loading hole 226 of device plate 224.

Also, for example, in a case in which suction nozzle 62 held by holding chuck 209 is determined as a defective nozzle by first nozzle inspection device 136 or second nozzle inspection device 138 which are described in detail below, holding chuck 209 holding the suction nozzle 62 is moved above discard box 228 by the operation of head moving device 207, and the defective nozzle is discarded to discard box 228.

(d) First Nozzle Inspection Device

First nozzle inspection device 136 is a device that performs inspection of the tip of suction nozzle 62, that is inspection of the state of suction tube 68 (hereinafter sometimes referred to as "tip inspection"), and inspection of the force required for the tip of suction nozzle 62 to retreat, that is inspection of the force required for suction tube 68 to retreat into body pipe 64 (hereinafter sometimes referred to as "retreat force inspection"), and is provided below nozzle transfer device 134.

As shown in FIG. 12, first nozzle inspection device 136 includes inspection unit 230 and unit moving device 232. Inspection unit 230 includes base 234, camera device 236, and load measuring device 238. Camera device 236 is provided facing up on base 234. Load measuring device 238 includes a load cell 240; load cell 240 is provided in an exposed state on base 234.

Unit moving device 232 includes fixed beam 250, movable beam 252, first slider 254, and second slider 256. Fixed beam 250 is provided on the frame of nozzle management device 112 extending in a front/rear direction. Movable beam 252 is held on fixed beam 250 extending in a left/right direction such that movable beam 252 can be slid forwards/backwards. Movable beam 252 is moved to any position in a forwards/backwards direction by the operation of first moving mechanism 258. First slider 254 is held on movable beam 252 so as to be slidable in a left/right direction, and is moved to any position in a left/right direction by the operation of second moving mechanism 260. Second slider 256 is held on first slider 254 so as to be slidable in an up/down direction, and is moved to any position in an up/down direction by the operation of third moving mechanism 262. Base 234 of inspection unit 230 is fixed to the top of second slider 256. Thus, unit moving device 232 functions as an XYZ-type moving device that moves inspection unit 230 to any position in up/down, left/right, and forwards/backwards directions.

Also, second pallet moving mechanism 266 is provided above first nozzle inspection device 136. Second pallet moving mechanism 266 is a mechanism for moving nozzle pallet 152 between a pallet carrier 180 circulated to a specified position by carrier circulating mechanism 182, and a position at which tip inspection and retreat force inspection can be performed by first nozzle inspection device 136 (hereinafter sometimes referred to as "first inspection position"). In detail, second pallet moving mechanism 266 includes rails 268 extending in a front/rear direction, and controllably slides nozzle pallet 152 along rails 268. The rear end of rails 268 links with rails 183 of pallet carrier 180 circulated to a specified position by carrier circulating mechanism 182. Thus, it is possible to move nozzle pallet 152 between a pallet carrier 180 circulated to a specified position by carrier circulating mechanism 182 and the first inspection position. Note that, in the diagram, a nozzle pallet 152 is shown moved to the first inspection position.

According to first nozzle inspection device 136 with the above configuration, when performing tip inspection, nozzle pallet 152 is moved to the first inspection position by second pallet moving mechanism 266. Then, camera device 236 of inspection unit 230 is moved below suction nozzle 62 which is the inspection target by unit moving device 232, and suction tube 68 of suction nozzle 62 which is the inspection target is imaged by camera device 236. Thus, image data of suction tube 68 of the suction nozzle 62 is obtained and the state of suction tube 68 is inspected based on the image data. If a problem such as a bent suction tube 68, a chipped tip of suction tube 68, a deformed suction tube 68, and so on is found by inspection based on the image data, examination is performed by first nozzle inspection device 136.

In detail, in a case in which a problem with suction tube 68 is found by inspection based on the image data, camera device 236 is moved below reference pipe 174 of nozzle pallet 152 by unit moving device 232, and reference pipe 174 is imaged by camera device 236. Then, the state of reference pipe 174 is inspected based on the acquired image data. A normal condition suction tube 68 is attached to the lower end of reference pipe 174, so if first nozzle inspection device is operating correctly, the suction tube 68 of reference pipe 174 will naturally be determined to be normal in the inspection based on the image data of reference pipe 174. Thus, in a case in which a problem is found with suction tube 68 by inspection based on image data of suction nozzle 62 which is the inspection target, and suction nozzle 68 of reference pipe 174 is determined to be normal by inspection based on the image data of reference pipe 174, the problem with suction tube 68 of suction nozzle 62 which is the target for inspection is confirmed and suction nozzle 62 which is the target for inspection is recognized as a defective nozzle. Conversely, in a case in which a problem is found with suction tube 68 by inspection based on image data of suction nozzle 62 which is the inspection target, and suction nozzle 68 of reference pipe 174 is determined to have a problem by inspection based on the image data of reference pipe 174, it is taken that first nozzle inspection device 136 cannot perform inspection properly, and suction nozzle 62 which is the target for inspection is not recognized as a defective nozzle.

Also, when retreat force inspection is performed by first nozzle inspection device 136, load cell 240 of inspection unit 230 is moved below suction nozzle 62 which is the target for inspection by unit moving device 232, and inspection unit 230 is moved up such that load cell 240 contacts the lower end of suction tube 68 of suction nozzle 62. Here, inspection unit 230 is moved up such that suction tube 68 of suction nozzle 62 retreats inside body pipe 64 by a set amount. Load cell 240 detects the load when suction tube 68 retreats inside body pipe 64 by a set amount and it is determined whether that detected value is larger than a threshold value. The value detected by load cell 240 indicates the force required for suction tube 68 to retreat inside body pipe 64; if this value is larger than a threshold value, it can be considered that the retreat of suction tube 68 into body pipe 64 is being impeded by a foreign object that has entered into suction tube 68, or by damage and so on to suction nozzle 62 or suction tube 68. Therefore, suction nozzles 62 for which the value detected by load cell 240 is determined to be larger than a threshold value are recognized as defective nozzles.

Note that, before retreat force inspection is performed, adjustment of load cell 240 is performed. In detail, before retreat force inspection is performed, load cell 240 is moved below reference pipe 174 by unit moving device 232, and inspection unit 230 is moved up such that load cell 240 contacts the lower end of section tube 68 of reference pipe 174. Here, inspection unit 230 is moved up such that suction tube 68 of reference pipe 174 retreats inside body pipe 64 by a set amount. Load cell 240 detects the load when suction tube 68 of reference pipe 174 retreats inside body pipe 64 by a set amount. Then, adjustment of load cell 240 is performed such that the detected load becomes the actual load when suction tube 68 of reference pipe 174 retreats inside body pipe 64 by a set amount.

(e) Second Nozzle Inspection Device

Second nozzle inspection device 138 is a device that performs inspection of the amount of air which flows inside suction nozzle 62 (hereinafter sometimes referred to as "air flow amount inspection"), and reading and inspection of 2D code 74 provided on flange 66 of suction nozzle 62 (hereinafter sometimes referred to as "code reading inspection"), and is provided below first nozzle inspection device 136.

As shown in FIG. 13, second nozzle inspection device 138 includes inspection head 270 and head moving device 272. Inspection head 270 includes camera 274 and air supply device 276. Camera 274 is attached to the lower end of inspection head 270 in a state facing down. Air supply device 276 includes air joint 278, air pressure sensor 280, and joint raising/lowering mechanism 282. Air joint 278 is connected to body pipe 64 of suction nozzle 62 when performing air flow amount inspection, and supplies air to suction nozzle 62 during air flow amount inspection via air joint 278. Air pressure sensor 280 is provided on the upper end of air joint 278 and measures the pressure of air supplied to suction nozzle 62. Joint raising/lowering mechanism 282 raises/lowers air joint 278 together with air pressure sensor 280.

Head moving device 272 includes movable beam 284 and slider 286. Movable beam 284 is held on fixed beam 250 of the above first nozzle inspection device 136 extending in a left/right direction and such that movable beam 284 can be slid forwards/backwards. Movable beam 284 is moved to any position in a forwards/backwards direction by the operation of first moving mechanism 288. Slider 286 is held on movable beam 284 so as to be slidable in a left/right direction, and is moved to any position in a left/right direction by the operation of second moving mechanism 290. Inspection head 270 is fixed to a side surface of slider 286. Thus, head moving device 272 functions as an XY-type moving device that moves inspection head 270 to any position in front/rear and left/right directions.

Also, third pallet moving mechanism 296 is provided below second nozzle inspection device 138. Third pallet moving mechanism 296 is a mechanism for moving nozzle pallet 152 between a pallet carrier 180 circulated to a specified position by carrier circulating mechanism 182, and a position at which flow amount inspection and code reading inspection can be performed by second nozzle inspection device 138 (hereinafter sometimes referred to as "second inspection position"). In detail, third pallet moving mechanism 296 includes rails 298 extending in a front/rear direction, and controllably slides nozzle pallet 152 along rails 298. The rear end of rails 298 links with rails 183 of pallet carrier 180 circulated to a specified position by carrier circulating mechanism 182. Thus, it is possible to move nozzle pallet 152 between a pallet carrier 180 circulated to a specified position by carrier circulating mechanism 182 and the second inspection position. Note that, in the diagram, a nozzle pallet 152 is shown moved to the second inspection position.

According to second nozzle inspection device 138 with the above configuration, when performing air flow amount inspection, nozzle pallet 152 is moved to the second inspection position by third pallet moving mechanism 296. Then, air supply device 276 of inspection head 270 is moved above suction nozzle 62 which is the target for inspection by head moving device 272. Air supply device 276 lowers air joint 278 by raising/lowering mechanism 282 and connects air joint 278 to body pipe 64 of suction nozzle 62 which is the target for inspection. When air joint 278 is connected to body pipe 64, air supply device 276 supplies air to the connected body pipe 64. Then, the air pressure while air is being supplied is measured by air pressure sensor 280 and it is determined whether the air pressure is larger than a first threshold pressure. When air is supplied to a normal condition suction nozzle 62, because air passes through suction nozzle 62, the air pressure measured by air pressure sensor 280 is relatively low. Conversely, when air is supplied to a suction nozzle 62 which is blocked or the like, air does not pass so easily through suction nozzle 62, thus the air pressure measured by air pressure sensor 280 is relatively high. Therefore, suction nozzles 62 for which the air pressure measured by air pressure sensor 280 is larger than a first threshold pressure are recognized as defective nozzles.

Note that, with air flow amount inspection, not only is recognition of defective nozzles performed, but recognition is performed of suction nozzles 62 which have a high probability of becoming defective nozzles, that is suction nozzles of which the condition has deteriorated (hereinafter sometimes referred to as "deteriorated nozzles"). In detail, a second threshold pressure which is lower than first threshold pressure is set. Then, it is determined whether the air pressure measured by air pressure sensor 280 is larger than a second threshold pressure, and suction nozzles 62 for which the air pressure is larger than the second threshold pressure are recognized as deteriorated nozzles. In other words, suction nozzles 62 for which, although not to the extent of a defective nozzle, air does not pass easily through the suction nozzle 62 to a certain extent are recognized as deteriorated nozzles.

Note that, during air flow amount inspection, air sent from a compressor (not shown) to air supply device 276 is supplied to suction nozzle 62, and the air pressure measured by air pressure sensor 280 changes depending on the operating conditions of the compressor. Therefore, before performing air flow amount inspection, air is supplied to reference pipe 174, and a first threshold pressure and a second threshold pressure are set based on the air pressure measured by air pressure sensor 280 as air is supplied to reference pipe 174.

Also, when performing code reading inspection, camera 274 of inspection head 270 is moved above suction nozzle 62 which is the target of inspection by head moving device 272, and 2D code 74 provided on flange 66 of suction nozzle 62 which is the target for inspection is imaged by camera 274. Thus, image data of 2D code 74 of suction nozzle 62 which is the target for inspection is obtained, and usually characteristic information of suction nozzle 62 such as an ID number is obtained based on the image data. However, if dirt and so on is on 2D code 74, there are cases in which characteristic information of suction nozzle 62 cannot be obtained based on the image data. Therefore, it is desirable to recognize suction nozzles 62 for which characteristic information of suction nozzle 62 cannot be obtained based on the image data as defective nozzles.

However, there is a worry that characteristic information of suction nozzle 62 cannot be obtained based on the image data even if there no dirt and so on 2D code 74, if there is a problem with camera 274 and so on. Thus, in cases in which characteristic information of suction nozzle 62 cannot be obtained based on image data, examination of camera 274 and so on is performed.

In detail, 2D code 74 provided on flange 66 of reference nozzle 172 is imaged by camera 274, and it is determined whether characteristic information of reference nozzle 172 is obtained based on the image data. So long as there is no dirt and so on on 2D code 74 of reference nozzle 172, and there are no problems which camera 274 and so on, characteristic information of reference nozzle 172 will be obtained based on the image data. Thus, if characteristic information cannot be obtained based on image data of 2D code 74 of suction nozzle 62 which is the target for inspection, and characteristic information is obtained based on image data of 2D code 74 of reference nozzle 172, suction nozzle 62 which is the target for inspection is recognized as a defective nozzle. Conversely, if characteristic information cannot be obtained based on image data of 2D code 74 of suction nozzle 62 which is the target for inspection, and characteristic information is not obtained based on image data of 2D code 74 of reference nozzle 172, it is taken that there is a problem with camera 274 and so on, and suction nozzle 62 which is the target for inspection is not recognized as a defective nozzle.

(f) Nozzle Cleaning Device

Nozzle cleaning device 140 is a device that performs cleaning and drying of suction nozzles 62 and is provided below second nozzle inspection device 138. As shown in FIG. 14, nozzle cleaning device 140 includes housing 300; cleaning and drying of suction nozzles 62 is performed inside housing 300. FIG. 15 shows nozzle cleaning device 140 without housing 300 to illustrate the configuration of nozzle cleaning device 140.

As shown in FIG. 15, nozzle cleaning device 140 includes nozzle cleaning mechanism 302 and nozzle drying mechanism 304. Nozzle cleaning mechanism 302 is configured from upper cleaning unit 306 and lower cleaning unit 308. Upper cleaning unit 306 and lower cleaning unit 308 have similar configurations and are provided facing each other in an up/down direction. Each unit 306 and 308 includes support frame 310, spray nozzle 312, and spray nozzle moving mechanism 314.

Support frame 310*a* of upper cleaning unit 306 is fixed to the top of housing 300; support frame 310*b* of lower cleaning unit 308 is fixed to the inside bottom of housing 300. Spray nozzle 312*a* of upper cleaning unit 306 is provided on the upper end inside housing 300 extending in a left/right direction, and is slidably supported in a front/rear direction by support frame 310*a* via the top of housing 300. Spray nozzle 312*a* is controllably slidable in a front/rear direction by spray nozzle moving mechanism 314*a* of upper cleaning unit 306. Spray nozzle 312*b* of lower cleaning unit 308 is provided on the lower end inside housing 300 extending in a left/right direction, and is slidably supported in a front/rear direction by support frame 310*b* via the top of housing 300. Spray nozzle 312*b* is controllably slidable in a front/rear direction by spray nozzle moving mechanism 314*b* of lower cleaning unit 308. Note that multiple spray holes (not shown) are formed in the bottom of spray nozzle 312*a* and multiple spray holes 316 are formed in the upper surface of spray nozzle 312*b*.

Nozzle drying mechanism 304 includes multiple ventilation pipes 320 provided to the rear of nozzle cleaning mechanism 302. Multiple ventilation pipes 320 are provided extending in a left/right direction on the top and bottom of housing 300. Ventilation pipes 320 are connected to a ventilation device (not shown) via a heater (not shown) such that warm air is blown through ventilation pipes 320. Also, multiple ventilation holes (not shown) are formed in ventilation pipes 320 on the attachment section to housing 300; through-holes are formed in the top and bottom of housing 300 to correspond to these ventilation holes. Thus, warm air is blown in housing 300 by nozzle drying mechanism 304.

Also, fourth pallet moving mechanism 330 is provided inside housing 300. Fourth pallet moving mechanism 330 is a mechanism for moving nozzle pallet 152 between a pallet carrier 180 circulated to a specified position by carrier circulating mechanism 182, and a position at which cleaning of suction nozzles 62 can be performed by nozzle cleaning mechanism 302 (hereinafter sometimes referred to as "cleaning position"). In detail, fourth pallet moving mechanism 330 includes rails 332 provided on inside walls of housing 300 and extending in a front/rear direction, and controllably slides nozzle pallet 152 along rails 332. The front end of rails 332 is positioned between upper cleaning unit 306 and lower cleaning unit 308. On the other hand, the rear end of rails 332 links with rails 183 of pallet carrier 180 circulated to a specified position by carrier circulating mechanism 182. Thus, it is possible to move nozzle pallet 152 between a pallet carrier 180 circulated to a specified position by carrier circulating mechanism 182 and the cleaning position. Note that, in the diagram, a nozzle pallet 152 is shown moved to the cleaning position.

According to nozzle cleaning mechanism 302 with the above configuration, when cleaning of suction nozzles 62, nozzle pallet 152 is moved to the cleaning position by fourth pallet moving mechanism 330. Then, high pressure water is supplied to each spray nozzle 312 of upper cleaning unit 306 and lower cleaning unit 308, and the high pressure water is sprayed from spray holes 316 of spray nozzles 312 towards nozzle pallet 152. Here, spray nozzles 312 are moved forwards/backwards by spray nozzle moving mechanism 314. Thus, high pressure high is sprayed on all suction nozzles 62 housed in nozzle pallet 152 such that cleaning of suction nozzles 62 is performed.

When cleaning of suction nozzles 62 is complete, nozzle pallet 152 is moved to the position at which nozzle drying mechanism 304 is arranged (hereinafter sometimes referred to as "drying position") by fourth pallet moving mechanism 330. Then, warm air is supplied to ventilation pipes 320 such that warm air is blown onto suction nozzles 62 housed in nozzle pallet 152. Thus, drying is performed of suction nozzles 62 cleaned by high pressure water.

Management of Suction Nozzles by the Nozzle Management Device

With the nozzle management device 112 with the above configuration, work of housing suction nozzles 62 loaded on a nozzle tray 88 into nozzle management device 112, work of loading suction nozzles 62 housed in nozzle management device 112 onto a nozzle tray 88, work of inspecting suction nozzles 62, and work of cleaning/drying suction nozzles is 62 are performed. Described below is the operating state of nozzle management device 112 while the above work is being performed.

(a) Work of Housing Suction Nozzles into the Nozzle Management Device

During work of housing suction nozzles into the nozzle management device, an operator sets a nozzle tray 88 on which suction nozzles 62 are loaded onto fixed stage 210 or movable stage 212 inside drawer 118 of nozzle management device 112. Also, with nozzle management device 112, a pallet carrier 180 housing nozzle pallet 152 onto which suction nozzles 62 can be loaded is moved to a position corresponding to first pallet moving mechanism 220 by the operation of carrier circulating mechanism 182.

Continuing, nozzle pallet 152 housed in the pallet carrier 180 is moved to the nozzle transfer position by the operation of first pallet moving mechanism 220. Then, as given above, suction nozzles 62 loaded on nozzle tray 88 are transferred to nozzle pallet 152, which was transferred to the nozzle transfer position, by nozzle transfer device 134. When transfer of suction nozzles 62 to nozzle pallet 152 is complete, that nozzle pallet 152 is housed in pallet carrier 180 by the operation of first pallet moving mechanism 220. Thus, the work of housing suction nozzles 62 in nozzle management device 112 is completed.

Note that, nozzle tray 88 which becomes empty due to the loading of suction nozzles 62 onto nozzle pallet 152 is collected by the operator from fixed stage 210 or movable stage 212. Alternatively, if nozzle tray 88 is set on movable stage 212, nozzle tray 88 which becomes empty due to the loading of suction nozzles 62 onto nozzle pallet 152 may be housed in tray carrier 200 by the operation of stage moving mechanism 214.

(b) Work of Loading onto a Nozzle Tray by the Nozzle Management Device

When work is performed for loading suction nozzles 62 housed in nozzle management device 112 onto a nozzle tray 88, an operator sets a nozzle tray 88 onto which suction nozzles 62 can be loaded onto fixed stage 210 or movable stage 212. Alternatively, a nozzle tray 88 onto which suction nozzles 62 can be loaded is set on movable stage 212 by the operation of stage moving mechanism 214. Also, with nozzle management device 112, a pallet carrier 180 housing a prescribed nozzle pallet 152 is moved to a position corresponding to first pallet moving mechanism 220 by the operation of carrier circulating mechanism 182. Suction nozzles 62 which are planned to be loaded onto nozzle tray 88 are housed in the prescribed nozzle pallet 152.

Continuing, nozzle pallet 152 housed in the pallet carrier 180 is moved to the nozzle transfer position by the operation of first pallet moving mechanism 220. Then, as given above, suction nozzles 62 loaded on nozzle pallet 152 are transferred to the nozzle tray 88 by nozzle transfer device 134. Thus, the work of housing suction nozzles 62 on nozzle tray 88 is completed. Note that, nozzle pallet 152 for which transfer of suction nozzles 62 to nozzle tray 88 is complete is housed in pallet carrier 180 by the operation of first pallet moving mechanism 220.

(c) Suction Nozzle Inspection Work

When inspection work of suction nozzles 62 is performed, a pallet carrier 180 housing a prescribed nozzle pallet 152 is moved to a position corresponding to second pallet moving mechanism 266 or third pallet moving mechanism 296. Suction nozzles 62 which are targets for inspection are housed in the prescribed nozzle pallet 152.

Continuing, nozzle pallet 152 housed in the pallet carrier 180 is moved to the first inspection position or the second inspection position by the operation of second pallet moving mechanism 266 or third pallet moving mechanism 296. Then, as given above, inspection work is performed with respect to suction nozzles 62 loaded on nozzle pallet 152 by first nozzle inspection device 136 or second nozzle inspection device 138. When inspection work of suction nozzles 62 is complete, nozzle pallet 152 is housed in pallet carrier 180 by the operation of second pallet moving mechanism 266 or third pallet moving mechanism 296. Note that, inspection work results are linked with the ID number of suction nozzle 62 which is the target for inspection and stored.

(d) Suction Nozzle Cleaning/Drying Work

When cleaning/drying work of suction nozzles 62 is performed, a pallet carrier 180 housing a prescribed nozzle pallet 152 is moved to a position corresponding to fourth pallet moving mechanism 330 by the operation of carrier circulating mechanism 182. Suction nozzles 62 which are targets for cleaning are housed in the prescribed nozzle pallet 152.

Continuing, nozzle pallet 152 housed in the pallet carrier 180 is moved to the nozzle cleaning position by the operation of fourth pallet moving mechanism 330. Then, as given above, cleaning work is performed with respect to suction nozzles 62 loaded on nozzle pallet 152 by nozzle cleaning mechanism 302. When cleaning work of suction nozzles 62 is complete, nozzle pallet 152 is moved to the drying position by the operation of fourth pallet moving mechanism 330. Then, as given above, drying work is performed with respect to suction nozzles 62 loaded on nozzle pallet 152 by nozzle drying mechanism 304. When drying work of suction nozzles 62 is complete, nozzle pallet 152 is housed in pallet carrier 180 by the operation of fourth pallet moving mechanism 330. Note that, with regard to suction nozzles 62 for which cleaning/drying are complete, information indicating that cleaning/drying work are complete is linked to the ID number of the suction nozzle 62 and stored.

Management of Suction Nozzles by the Nozzle Management System

As given above, for multiple nozzle management devices 112, the management of suction nozzles 62 housed in each nozzle management device 112 can be performed individually, but with nozzle management system 110, unified management of all suction nozzles 62 housed in the multiple nozzle management devices 112 is possible. In detail, information related to suction nozzles 62 housed in each nozzle management device 112 is sent from each of the multiple nozzle management devices 112 and information related to all suction nozzles 62 housed in the multiple nozzle management devices 112 is stored in control device 114 of nozzle management system 110. Thus, for example, in a case in which not all of multiple suction nozzles planned to be loaded in nozzle tray 88 (hereinafter sometimes referred to as "required suction nozzles") are housed in one nozzle management device 112, a suction nozzle 62 housed in another nozzle management device 112 can be used such that all the required suction nozzles can be loaded in nozzle tray 88.

(a) Cases in which it is Possible to Load the Required Suction Nozzles in the Target Nozzle Management Device Specifically, when information related to the required suction nozzles is entered into one nozzle management device out of the multiple nozzle management devices 112 (hereinafter sometimes referred to as "target nozzle management device"), determination is performed in control device 114 as to whether all the required suction nozzles are housed in the target nozzle management device. Then, in a case in which all the required suction nozzles are housed in the target nozzle management device, according to the procedure given above, all the required suction nozzles are loaded on nozzle tray 88 in the target nozzle management device.

Note that, as given above, with nozzle management device 112, inspection of suction nozzles 62 is performed and recognition of defective nozzles is performed. Thus, for example, in a case in which a required suction nozzle is housed in nozzle management device 112 as a defective nozzle, it is desirable not to load that kind of defective nozzle on nozzle tray 88 as a required nozzle. Thus, when the determination is performed as to whether required suction nozzles are housed in nozzle management device 112, defective nozzles are exempted from being determination target suction nozzles 62.

Also, nozzle tray 88 on which the required suction nozzles are to be loaded may be a nozzle tray 88 housed in tray carrier 200 of the target nozzle management device, or may be a nozzle tray 88 which an operator has set on fixed stage 210 or movable stage 212 of the target nozzle management device. Also, an operator may set an empty nozzle tray 88 on fixed stage 210 or movable stage 212 of the target nozzle management device, or may set a nozzle tray 88 on which a suction nozzle 62 is loaded on fixed stage 210 or movable stage 212 of the target nozzle management device. However, in a case in which a nozzle tray 88 on which a suction nozzle 62 is loaded is set, loading of required suction nozzles on the nozzle tray 88 is performed after performing transfer work from that nozzle tray 88 to nozzle pallet 152.

(b) Cases in which it is Possible to Load the Required Suction Nozzles in a Non-Target Nozzle Management Device On the other hand, in a case in which not all the required suction nozzles are housed in the target nozzle management device, control device 114 determines whether all the required suction nozzles are housed in any of the nozzle management devices among the multiple nozzle management devices 112 except for the target nozzle management device (hereinafter sometimes referred to as "non-target nozzle management device"). In a case in which all the required suction nozzles are housed in one of the non-target nozzle management devices, control device 114 displays information related to the non-target nozzle management device housing all the required suction nozzles on panel 120 of the target nozzle management device. Thus, an operator can know the fact that all of the required suction nozzles can be loaded on nozzle tray 88 if that non-target nozzle management device is used.

Further, control device 114 sends information related to the required suction nozzles to the non-target nozzle management device in which all the required suction nozzles are housed. Thus, all the required nozzles are loaded on nozzle tray 88 in the non-target nozzle management device housing all the required suction nozzles. Note that, nozzle tray 88 on which the required suction nozzles are to be loaded may be a nozzle tray 88 housed in tray carrier 200 of the non-target nozzle management device, or may be a nozzle tray 88 which an operator has set on fixed stage 210 or movable stage 212 of the non-target nozzle management device.

(c) Cases in which it is Possible to Load the Required Suction Nozzles in Multiple Nozzle Management Devices On the other hand, in a case in which not all the required suction nozzles are housed in any of the non-target nozzle management devices, control device 114 determines whether any suction nozzles from among the required suction nozzles not housed in the target nozzle management device (hereinafter sometimes referred to as "non-housed suction nozzle") are housed in any of the non-target nozzle management devices. In a case in which non-housed suction nozzles are housed in one of the non-target nozzle management devices, suction nozzles from among the required suction nozzles except for non-housed suction nozzles (hereinafter sometimes referred to as "housed suction nozzles") are loaded on nozzle tray 88.

Here, control device 114 displays information related to the non-target nozzle management device housing the non-housed suction nozzles on panel 120 of the target nozzle management. Then, an operator sets nozzle tray 88 on which housed suction nozzles are loaded onto fixed stage 210 or movable stage 212 of the non-target nozzle management device displayed on panel 120 of the target nozzle management device. Also, control device 114 sends information related to non-housed suction nozzles to a non-target nozzle management device in which non-housed suction nozzles are housed. Thus, non-housed suction nozzles are loaded on nozzle tray 88 on which housed suction nozzles are loaded in a non-target nozzle management device in which non-housed suction nozzles are housed such that all required suction nozzles are loaded on nozzle tray 88.

As given above, with nozzle management system 110, even in a case in which not all required suction nozzles are housed in the target nozzle management device, suction nozzles housed in non-target nozzle management devices can be used such that all required suction nozzles can be loaded on nozzle tray 88. Thus, it is not necessary to house many suction nozzles 62 in one nozzle management device 112, meaning that it is possible to curb the purchase of excessive suction nozzles 62.

(d) Cases in which the Non-Housed Suction Nozzles are not Housed in the Multiple Nozzle Management Devices Also, in a case in which not all the required suction nozzles are housed in the target nozzle management device and non-housed suction nozzles are not housed in any of the non-target nozzle management devices, that is, in a case in which non-housed suction nozzles are not housed in any of the multiple management devices 112 that configure the nozzle management system 110, control device 114 displays information related to non-housed suction nozzles and the fact that the non-housed suction nozzles are not housed in any of the multiple nozzle management systems 112 on panel 120. Thus, an operator can recognize the fact that non-housed suction nozzles are not present and perform ordering or the like of non-housed suction nozzles.

Note that, control device 114 may send information related to non-housed suction nozzles to a device other than panel 120. For example, control device 114 may send information related to non-housed suction nozzles to a control device or the like for performing management of electronic component and so on. Also, control device 114 may send information related to non-housed suction nozzles to a product ordering device or the like connected to a network. That is, non-housed suction nozzles may be ordered automatically from a supplier using a network or the like.

(e) Management of Suction Nozzles According to a Production Plan

With nozzle management system 110, management of suction nozzles 62 can be performed according to a production plan of a prescribed period. In detail, for example, required suction nozzles for each circuit board planned for production is entered into control device 114 based on a production plan for one week. Then, determination is performed as to whether the required suction nozzles for each circuit board planned for production are housed in any of the multiple nozzle management devices 112 of nozzle management system 110. If all the required suction nozzles for all circuit boards planned for production are housed in any of the multiple nozzle management devices 112, according to the above method, the required suction nozzles can be loaded on nozzle tray 88 when performing production of all circuit boards planned for production. However, if not all the required suction nozzles for all circuit boards planned for production are housed in any of the multiple nozzle management devices 112, there is a worry that required suction nozzles cannot be loaded on nozzle tray 88 and that production of circuit boards cannot be performed as planned. Therefore, control 114 outputs information related to suction nozzles not housed in any of the nozzle management devices 112 from among all the required suction nozzles of circuit boards planned for production to a device such as panel 120. Thus, an operator or the like can perform ordering or the like of suction nozzles which are not present, and the production plan of the prescribed period can be performed smoothly.

(f) Loading to Nozzle Trays Considering the Deterioration of Suction Nozzles

As given above, with nozzle management system 110, when determining whether suction nozzles 62 are housed in nozzle management device 112, defective nozzles are exempted from being determination target suction nozzles 62. Thus, loading of defective nozzles to nozzle tray 88 can be prevented, which prevents mounting work and so on being performed by a suction nozzle 62 with a problem. However, there is a worry that suitable mounting work cannot be performed by a suction nozzle 62 for which deterioration has progressed, even if the suction nozzle 62 is not a defective nozzle. Especially, when performing management of suction nozzles 62 according to a production plan of a prescribed period as given above, there is a possibility that a suction nozzle for which deterioration has progressed will become a defective nozzle. Therefore, with nozzle management system 110, not only are defective nozzles exempted from being determination target suction nozzles 62, but suction nozzles which have been determined as having deteriorated by air supply device 276 are exempted from being determination target suction nozzles 62. Thus, when performing management of suction nozzles 62 according to a production plan of a prescribed period, it is possible to prevent the loading of suction nozzles 62 which have a high probability of becoming defective nozzles to nozzle tray 88, thereby making it possible to construct a highly reliable management system.

Also, control device 114 may send data related to deteriorated nozzles to a device such as panel 120. Thus, it is possible to recognize the presence of suction nozzles 62 which have a high probability of becoming defective nozzles, and to perform ordering or the like of suction nozzles 62 to replace deteriorated nozzles.

Note that, as shown in FIG. 6, control device 114 of nozzle management system 110 includes transfer information acquisition section 350, housed nozzle information acquisition section 352, first determination section 354, second determination section 356, information notifying section 358, command output section 360, and deterioration estimating section 362. Transfer information acquisition section 350 is a functional section that acquires information related to required suction nozzles. Housed nozzle information acquisition section 352 is a functional section that acquires information related to suction nozzles 62 housed in multiple nozzle management devices 112 from each nozzle management device 112. First determination section 354 is a functional section that determines whether all required suction nozzles are housed in the target nozzle management device. Second determination section 356 is a functional section that determines whether non-housed suction nozzles are housed in non-target nozzle management devices. Information notifying section 358 is a functional section that sends information related to non-housed suction nozzles to a device such as panel 120. Command output section 360 is a functional section that sends a command to load suction nozzle 62 on nozzle tray 88 to the target nozzle management device and non-target nozzle management devices. Deterioration estimating section 362 is a functional section that recognizes deteriorated nozzles by inspecting suction nozzles 62 using air supply device 276.

Note that, in the above embodiment, suction nozzle 62 is an example of a suction nozzle. Nozzle tray 88 is an example of a nozzle tray. Nozzle management system 110 is an example of a nozzle management system. Nozzle management device 112 is an example of a nozzle management device. Control device 114 is an example of a control device. Panel 120 is an example of any device. Nozzle transfer device 134 is an example of a transfer mechanism. First nozzle inspection device 136 and second nozzle inspection device 138 are each an example of an inspection mechanism. Nozzle cleaning device 140 is an example of a cleaning mechanism. Nozzle pallet 152 is an example of a housing section. Transfer information acquisition section 350 is an example of a transfer information acquisition section. Housed nozzle information acquisition section 352 is an example of a housed nozzle information acquisition section. First determination section 354 is an example of a first determination section. Second determination section 356 is an example of a second determination section. Information notifying section 358 is an example of an information notifying section. Command output section 360 is an example of a command output section. Deterioration estimating section 362 is an example of a deterioration estimating section.

Further, the present disclosure is not limited to the above example embodiment, and various changed or improved methods of embodiment are possible based on the knowledge of someone skilled in the art. Specifically, for example, in the above embodiment, multiple nozzle management devices 112 are each connected to control device 114 and functional sections such as transfer information acquisition section 350 are provided in control device 114; however, it is not necessary to provide a control device 114, control devices of each of the multiple nozzle management devices 112 may be connected to each other, and functional sections such as transfer information acquisition section 350 may be provided in the individual control device of each nozzle management device 112. Also, control device 114 may be connected to each multiple nozzle management device 112 and functional sections such as transfer information acquisition section 350 may be provided in the control device 114 and in the individual control device of each nozzle management device 112.

Also, in the above embodiment, recognition of deteriorated nozzles is performed based on inspection results of air supply device 276, but recognition of deteriorated nozzles may be performed based on the inspection results of another inspection device such as first nozzle inspection device 136. Also, recognition of deteriorated nozzles may also be performed based on a count of usage years, quantity of times used, and so on.

REFERENCE SIGNS LIST

62: suction nozzle; 88: nozzle tray; 110: nozzle management system; 112: nozzle management device (nozzle housing device); 114: control device; 120: panel (any device); 134: nozzle transfer device (transfer device); 136: first nozzle inspection device (inspection mechanism); 138: second nozzle inspection device (inspection mechanism); 140: nozzle cleaning device (cleaning mechanism); 152: nozzle pallet (housing section); 350: transfer information acquisition device; 352: housed nozzle information acquisition section; 354: first determination section; 356: second determination section; 358: information notifying section; 360: command output section; 362: deterioration estimating section

The invention claimed is:

1. A nozzle management system comprising:
multiple nozzle housing devices which include a housing section that houses suction nozzles for picking up and holding an electronic component and a transfer mechanism for transferring a suction nozzle housed in the housing section to a nozzle tray; and a control device which includes a transfer information acquisition section that acquires information related to at least one suction nozzle which is required to be transferred to a nozzle tray;

wherein the control device has a housed nozzle information acquisition section that acquires information related to suction nozzles housed in the housing section of the respective multiple nozzle housing devices, a first determination section that, when suction nozzles housed in the housing section of a prescribed nozzle housing device from among the multiple nozzle housing devices are transferred to a nozzle tray, determines whether all the required suction nozzles are housed in the housing section of the prescribed nozzle housing device based on information acquired by the transfer information acquisition device, and a second determination section that, in a case in which not all the required suction nozzles are housed in the housing section of the prescribed nozzle housing device, determines whether non-housed suction nozzles which are not stored in the housing section of the prescribed nozzle housing device from among the required suction nozzles are stored in the housing section of a nozzle housing device other than the prescribed nozzle housing device from among the multiple nozzle housing devices.

2. The nozzle management system according to claim 1, wherein the control device includes an information notifying section that notifies any device of information related to the non-housed suction nozzles in a case in which the non-housed suction nozzles are not housed in the housing section of a nozzle housing device other than the prescribed nozzle housing device from among the multiple nozzle housing devices.

3. The nozzle management system according to claim 1, wherein the control device includes a command output section that, in a case in which non-housed suction nozzles are housed in the housing section of a nozzle housing device other than the prescribed nozzle housing device from among the multiple nozzle housing devices, outputs a command to the nozzle housing device which houses the non-housed suction nozzles from among the multiple nozzle housing devices to transfer the non-housed suction nozzles to a nozzle tray.

4. The nozzle management system according to claim 3, wherein the command output section outputs a command to the prescribed nozzle housing device to transfer housed suction nozzles except for the non-housed suction nozzles from among the required suction nozzles to a nozzle tray, and outputs a command to the nozzle housing device which houses the non-housed suction nozzles from among the multiple nozzle housing devices to transfer the non-housed suction nozzles to the nozzle tray to which the housed suction nozzles were transferred.

5. The nozzle management system according to claim 3, wherein the command output section, in a case in which all the required suction nozzles are stored in the nozzle housing device which houses the non-housed suction nozzles from among the multiple nozzle housing devices, outputs a command to the nozzle housing device to transfer all the required suction nozzles including the non-housed suction nozzles to a nozzle tray.

6. The nozzle management system according to claim 1, wherein the control device has a deterioration estimating section that estimates the deterioration of suction nozzles housed in the housing section, and at least one of the first determination section and the second determination section performs determination such that suction nozzles determined to be deteriorated by the deterioration estimating section are considered as not housed in the housing section.

7. The nozzle management system according to claim 1, wherein the transfer information acquisition section acquires information related to the required suction nozzles according to a production plan of a prescribed period.

8. The nozzle management system according to claim 1, wherein at least one among the multiple nozzle housing devices has at least one of an inspection mechanism that performs inspection of suction nozzles housed in the housing section, and a cleaning mechanism that performs cleaning of suction nozzles housed in the housing section.

* * * * *